United States Patent
Curran et al.

(10) Patent No.: US 11,493,957 B2
(45) Date of Patent: Nov. 8, 2022

(54) TITANIUM PARTS HAVING A BLASTED SURFACE TEXTURE

(71) Applicant: Apple Inc., Cupertino, CA (US)

(72) Inventors: James A. Curran, Sunnyvale, CA (US); Sonja R. Postak, Sunnyvale, CA (US); Todd S. Mintz, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/127,948

(22) Filed: Dec. 18, 2020

(65) Prior Publication Data

US 2021/0109568 A1    Apr. 15, 2021

Related U.S. Application Data

(62) Division of application No. 16/584,692, filed on Sep. 26, 2019, now Pat. No. 10,901,458.

(60) Provisional application No. 62/737,669, filed on Sep. 27, 2018.

(51) Int. Cl.
| | |
|---|---|
| *G06F 1/16* | (2006.01) |
| *C25D 11/26* | (2006.01) |
| *H05K 5/00* | (2006.01) |
| *H05K 5/04* | (2006.01) |
| *C22C 14/00* | (2006.01) |
| *C25D 11/02* | (2006.01) |

(52) U.S. Cl.
CPC .......... *G06F 1/1626* (2013.01); *C25D 11/022* (2013.01); *C25D 11/26* (2013.01); *H05K 5/0086* (2013.01); *C22C 14/00* (2013.01); *H05K 5/04* (2013.01)

(58) Field of Classification Search
CPC ......... G06F 1/1626; C25D 11/26; H05K 5/04; H05K 5/0086; C22C 14/00
USPC ....................................................... 428/469
See application file for complete search history.

(56) References Cited

U.S. PATENT DOCUMENTS

| | | |
|---|---|---|
| 4,344,996 A | 8/1982 | Banks et al. |
| 8,846,551 B2 | 9/2014 | Gupta et al. |
| 2006/0269704 A1 | 11/2006 | Chen |
| 2008/0233456 A1 | 9/2008 | Ishikawa et al. |
| 2010/0272963 A1 | 10/2010 | Li et al. |
| 2011/0036399 A1 | 2/2011 | Lin et al. |
| 2011/0056836 A1 | 3/2011 | Tatebe et al. |
| 2012/0002282 A1 | 1/2012 | Nagahama et al. |

(Continued)

FOREIGN PATENT DOCUMENTS

| | | |
|---|---|---|
| CN | 1870863 A | 11/2006 |
| CN | 101997040 A | 3/2011 |

(Continued)

OTHER PUBLICATIONS

Kawakami et al., JP 2011/021234 A machine translation, Feb. 3, 2011, entire machine translation (Year: 2011).*

*Primary Examiner* — Humera N. Sheikh
*Assistant Examiner* — Katherine A Christy
(74) *Attorney, Agent, or Firm* — Dorsey & Whitney LLP

(57) ABSTRACT

An enclosure for a portable electronic device includes a titanium substrate having a textured surface that includes peaks separated by valleys, where the textured surface is characterized as having (i) an Sdq (root mean square gradient) that is greater than 0.2 micrometers, and (ii) a gloss value that is greater than 90 gloss units as measured at 60 degrees by a gloss meter.

11 Claims, 24 Drawing Sheets

(56) References Cited

U.S. PATENT DOCUMENTS

| | | | |
|---|---|---|---|
| 2012/0175548 A1 | 7/2012 | Shin et al. | |
| 2012/0251779 A1 | 10/2012 | Liu et al. | |
| 2013/0043135 A1 | 2/2013 | Demers et al. | |
| 2015/0103123 A1 | 4/2015 | Chen et al. | |
| 2015/0291827 A1 | 10/2015 | Lee et al. | |
| 2016/0105206 A1 | 4/2016 | Zhang et al. | |
| 2016/0230302 A1* | 8/2016 | Kang | C25D 11/18 |
| 2017/0336535 A1 | 11/2017 | Shima et al. | |
| 2017/0347476 A1 | 11/2017 | Hwang et al. | |
| 2018/0084658 A1 | 3/2018 | Curran et al. | |
| 2018/0239066 A1 | 8/2018 | Tachibana et al. | |
| 2018/0263130 A1 | 9/2018 | Curran et al. | |

FOREIGN PATENT DOCUMENTS

| | | | |
|---|---|---|---|
| CN | 102597331 A | 7/2012 | |
| CN | 101088030 B | 11/2013 | |
| CN | 103732023 A | 4/2014 | |
| CN | 103732804 A | 4/2014 | |
| CN | 105051131 A | 11/2015 | |
| CN | 105506704 A | 4/2016 | |
| CN | 107338466 A | 11/2017 | |
| CN | 107379586 A | 11/2017 | |
| CN | 107517552 A | 12/2017 | |
| CN | 107787309 A | 3/2018 | |
| CN | 108139660 A | 6/2018 | |
| CN | 108570676 A | 9/2018 | |
| EP | 2471868 A1 | 7/2012 | |
| EP | 2749408 A1 | 7/2014 | |
| JP | 2011021234 A | 2/2011 | |
| TW | 200822983 A | 6/2008 | |

\* cited by examiner

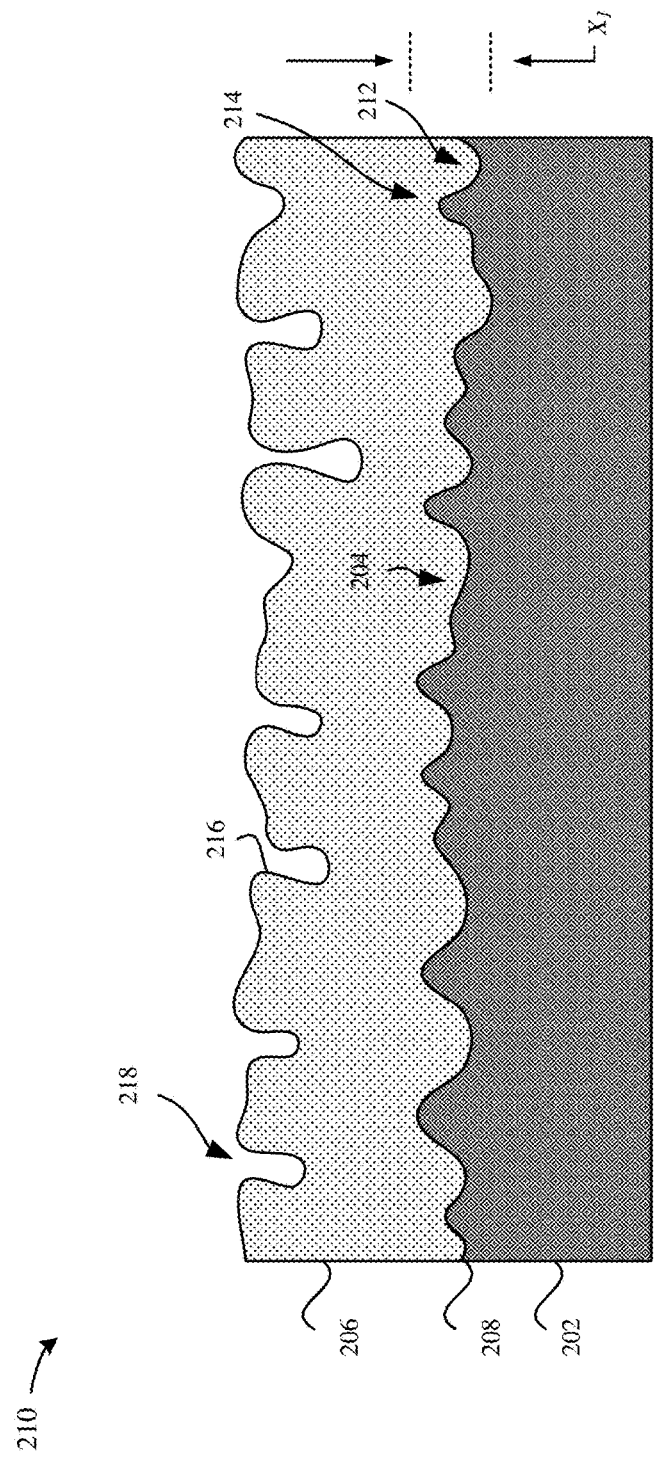

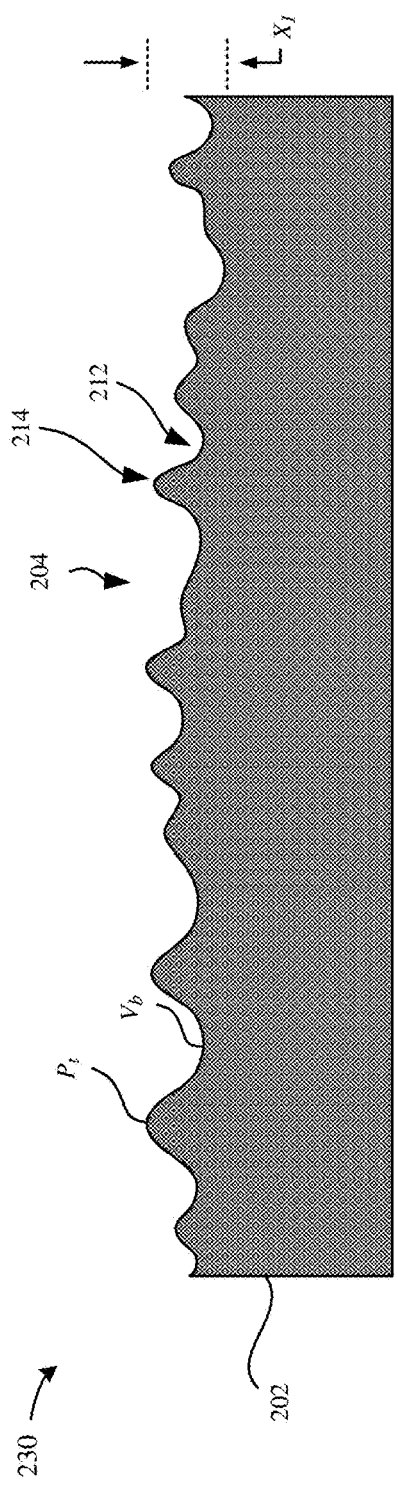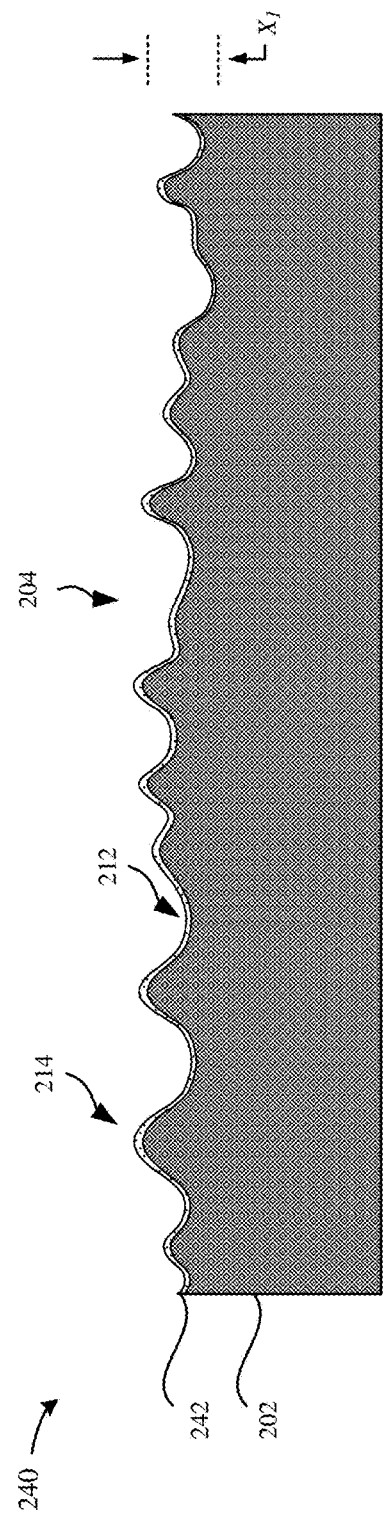
FIG. 2D
FIG. 2E

2 Minutes

4 Minutes

7 Minutes

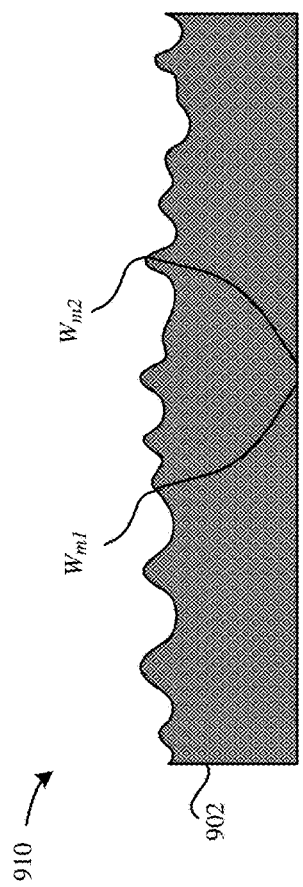
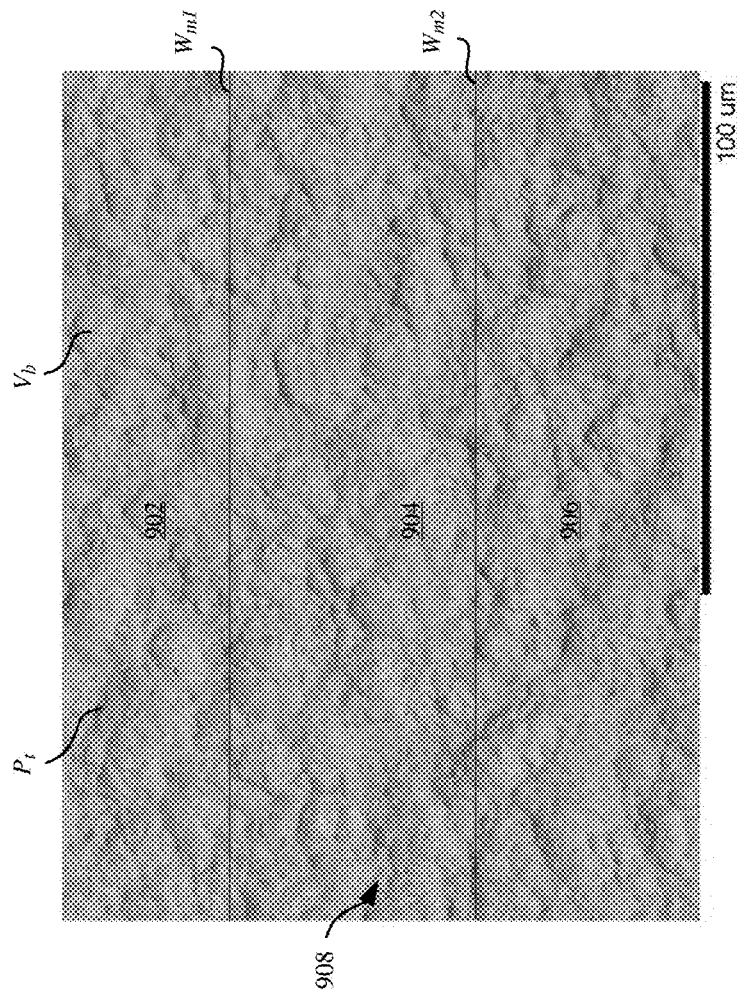
FIG. 10A
FIG. 10B

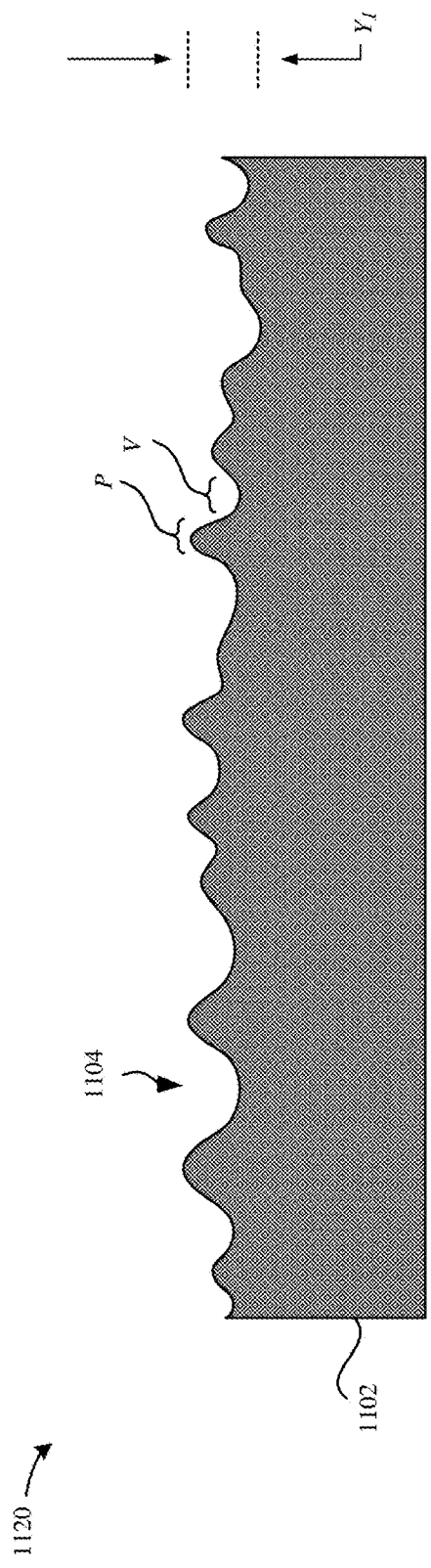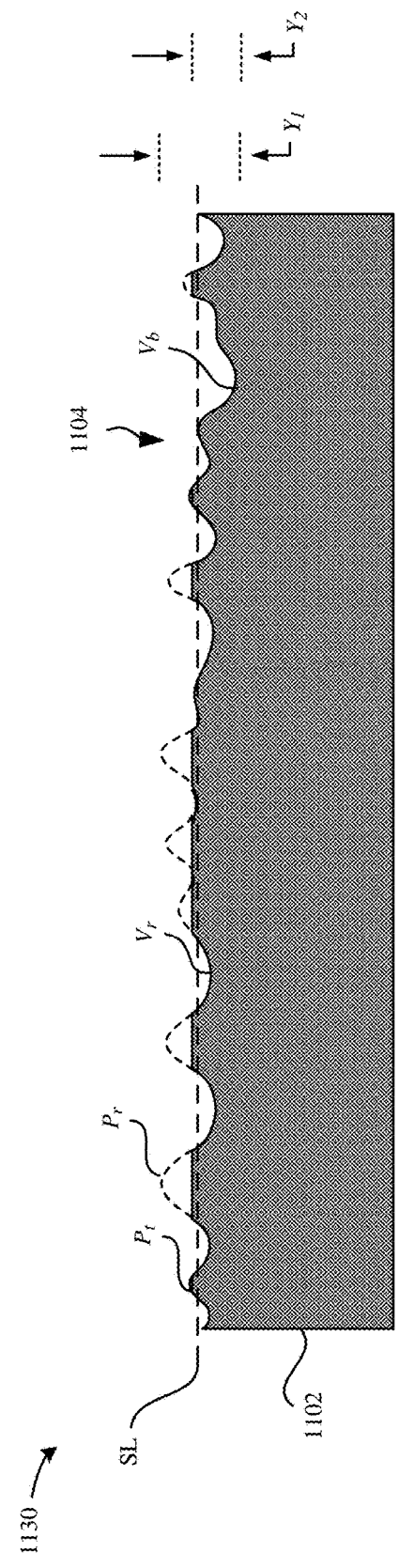

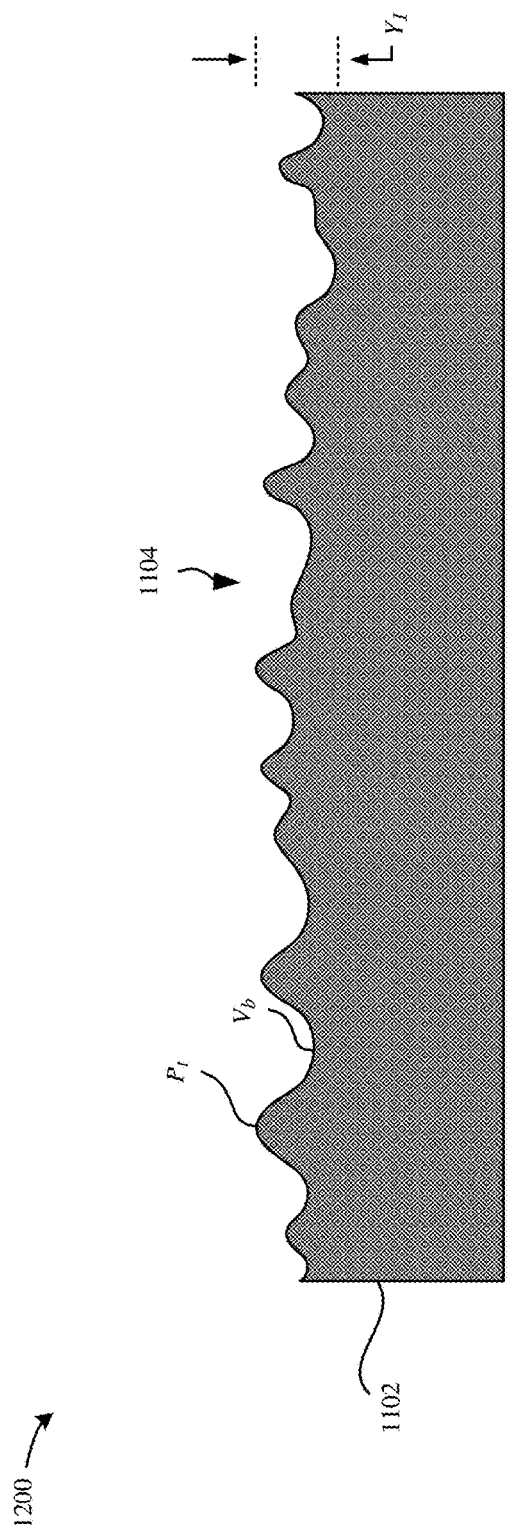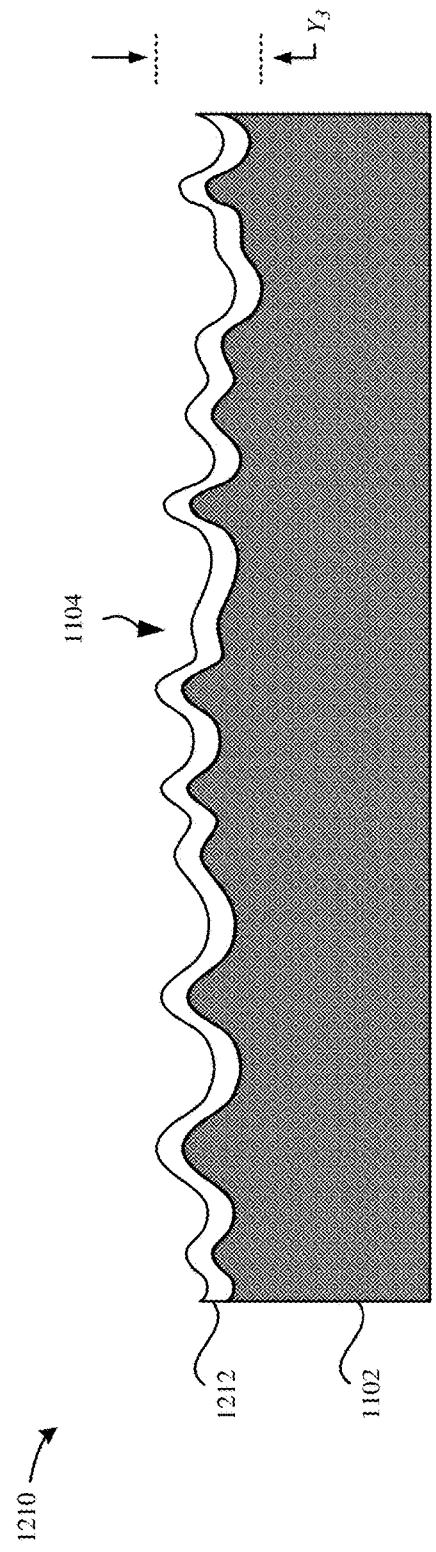
FIG. 12A
FIG. 12B

TITANIUM PARTS HAVING A BLASTED SURFACE TEXTURE

CROSS-REFERENCE TO RELATED APPLICATIONS

The present application is a divisional of U.S. patent application Ser. No. 16/584,692, entitled "TITANIUM PARTS HAVING A BLASTED SURFACE TEXTURE," filed Sep. 26, 2019, which claims the benefit of U.S. Provisional Application No. 62/737,669, entitled "TEXTURED SURFACE FOR TITANIUM PARTS," filed Sep. 27, 2018, the contents of which are incorporated herein by reference their entireties for all purposes.

FIELD

The described embodiments relate generally to techniques for forming an etched titanium part. More particular, the described embodiments relate to systems and methods for restoring a gloss finish of the etched titanium part.

BACKGROUND

Portable electronic devices can include various operational components (e.g., display, processor, antenna, etc.). Enclosures for these portable electronic devices can be formed of various metals (e.g., anodized aluminum, etc.) having a high amount of strength and stiffness to protect these operational components. Additionally, it is preferable to process these enclosures such as to impart these enclosures with an attractive surface finish. However, specific types of metals, although having a high amount of strength and stiffness, are also difficult to process to impart an attractive surface finish. Accordingly, there is a need to implement techniques for processing these specific types of metals.

SUMMARY

This paper describes various embodiments that relate generally to techniques for etching a titanium part. More particularly, the described embodiments relate to systems and methods for restoring gloss finish of the etched titanium part.

According to some embodiments, an enclosure for a portable electronic device is described. The enclosure includes a titanium substrate having a textured surface having (i) an Sdq (root mean square gradient) that is greater than 0.2 micrometers, and (ii) a gloss value that is greater than 90 gloss units as measured at 60 degrees by a gloss meter.

According to some embodiments, an enclosure for a portable electronic device is described. The enclosure includes a titanium substrate including a textured surface having peaks separated by valleys, where apexes of the peaks are separated from troughs of the valleys by at least 2 micrometers, and the textured surface has a gloss value that is greater than 90 gloss units as measured at 60 degrees by a gloss meter.

According to some embodiments, an enclosure for a portable electronic device is described. The enclosure includes a titanium substrate including a textured surface having alternating peaks separated by valleys, where the textured surface is characterized as having an Sq (root mean square height) that is greater than 0.2 micrometers. The enclosure further includes an anodized layer that overlays a portion of the textured surface.

This Summary is provided merely for purposes of summarizing some example embodiments so as to provide a basic understanding of some aspects of the subject matter described herein. Other aspects and advantages of the invention will become apparent from the following detailed description taken in conjunction with the accompanying drawings which illustrate, by way of example, the principles of the described embodiments. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 2A-2E illustrate cross-sectional views of a process for forming a texturized surface of a metal part, in accordance with some embodiments.

FIGS. 10A-10B illustrate exemplary views of a welded metal part having a textured surface, in accordance with some embodiments.

FIGS. 11A-11E illustrate cross-sectional views of a process for forming a metal part having a blasted surface, in accordance with some embodiments.

FIGS. 12A-12E illustrate cross-sectional views of a process for forming a metal part having an anodic layer, in accordance with some embodiments.

Figure 1:
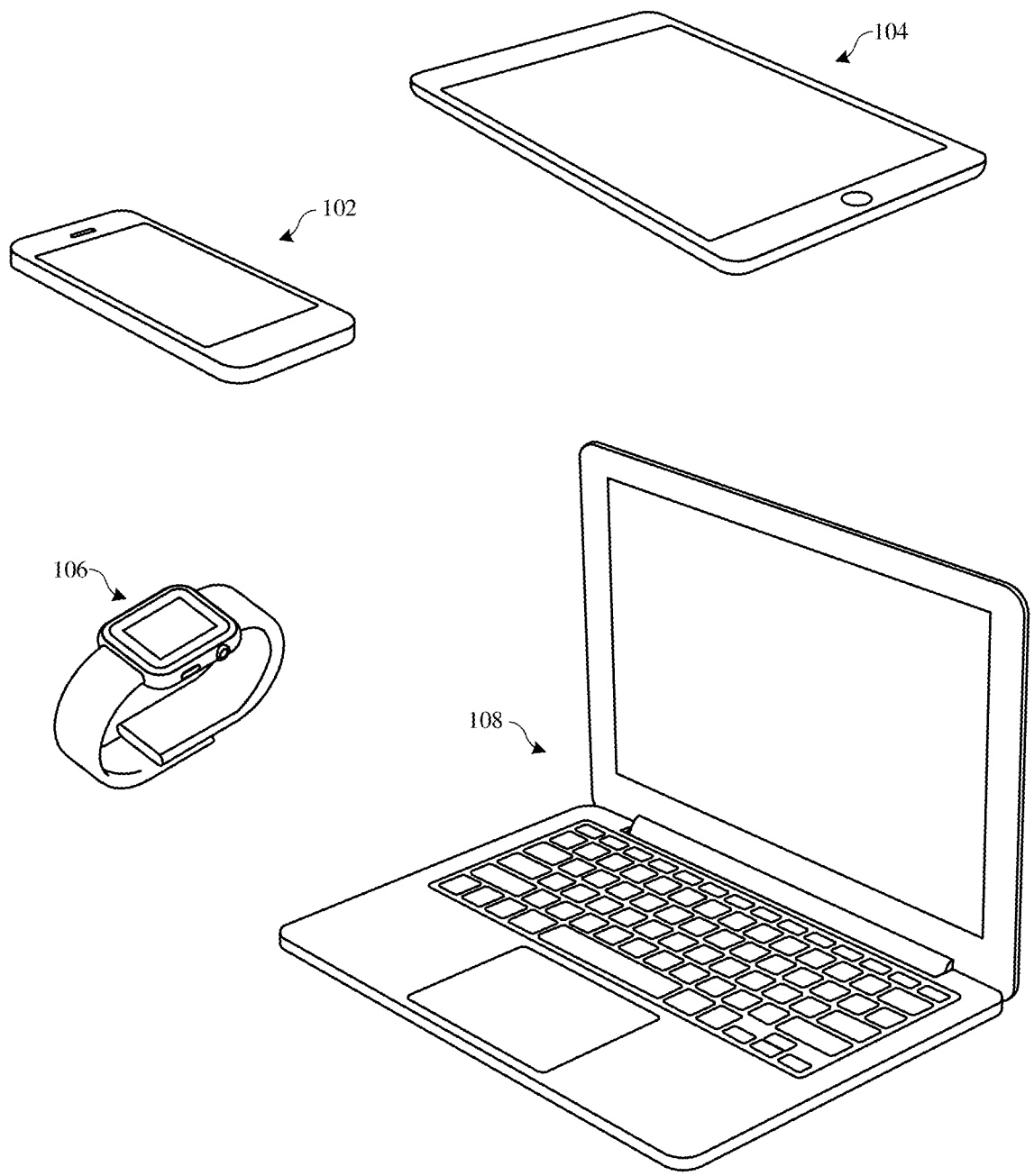
FIG. 1 illustrates perspective views of various devices having surfaces that may be processed using the techniques described herein, in accordance with some embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Portable electronic devices can include various operational components (e.g., display, processor, antenna, etc.). Enclosures of these portable electronic devices are capable of protecting these operational components from physical damage, such as during a drop event. The enclosures may be formed of various metals, such as anodized aluminum, which has a high amount of strength and stiffness that is sufficient to protect these operational components. Additionally, the surface finishes of these enclosures should also be aesthetically attractive. Titanium and alloys thereof may be utilized to form the enclosures of portable electronic devices. Indeed, titanium is harder than anodized aluminum. However, this hardness also makes it very difficult to etch and/or chemically etch titanium. As a result, titanium is characterized as having a high gloss surface finish, which may be considered aesthetically unattractive in some examples.

In other instances, it may be desirable to etch titanium while retaining a high-gloss surface finish via a blasting process that imparts the blasted and etched titanium part with a fine-scale roughness. In this manner, the blasted and etched titanium part is imparted with a distinctive surface finish that both diffusely and specularly reflects visible light. As a result, the blasted and etched titanium part is distinguished in both structure and appearance from a blasted conventional titanium part and a chemically etched titanium part. For example, the blasting process imparts the blasted and etched titanium part with a surface finish that is about 50%-70% of the surface finish of a conventional blasted titanium part. However, the fine-scale roughness of the etched titanium part and the blasted and etched titanium part is beneficial for hiding surface defects, such as weld lines and crystallographic grain structure differences. In contrast, only blasting a titanium part in a conventional manner fails to impart benefits like hiding weld lines.

According to some examples, it may be preferable to utilize a combination of an etching and blasting process while anodizing the titanium part. In particular, the anodized layer of an etched and blasted titanium part may be protected from chemical (e.g., fingerprint oils) and mechanical removal (e.g., rubbing against objects) due to the anodized layer being recessed and submerged within the valleys of the textured surface of the anodized part that has been etched and blasted.

The embodiments described herein set forth techniques for texturizing the surface of titanium, titanium alloys, and other anodizable, hard metals (e.g., hafnium, zirconium, etc.) such as to impart a low gloss, matte surface finish. In particular, an electrochemical oxidation process may be applied to a titanium substrate (and other anodizable, hard metals) to form a metal oxide layer. The electrochemical oxidation process may texturize a surface of the underlying titanium substrate such as to form alternating peaks and valleys. Thereafter, the metal oxide layer is stripped and separated from the underlying titanium substrate such as to reveal the texturized surface.

In some examples, the color of the anodized layer may be characterized according to CIE L*a*b* color-opponent dimension values. The L* color opponent dimension value is one variable in an L*a*b* color space. In general, L* corresponds to an amount of lightness. L*=0 represents an extreme black while L*=100 represents white. In general, a* indicates amounts of red color and green color in a sample. A negative a* value indicates a green color, while a positive a* value indicates a red color. Accordingly, samples having a positive a* value will indicate that more red than green is present. In general, b* indicates amounts of blue color and yellow color in a sample. A negative b* value indicates a blue color, while a positive b* value indicates yellow color. Accordingly, samples having a positive b* value will indicate more yellow than blue is present.

According to some embodiments, an enclosure for a portable electronic device is described. The enclosure includes a titanium substrate including a textured surface having (i) an Sdq (root mean square gradient) that is greater than 0.2 micrometers, and (ii) a gloss value that is greater than 90 gloss units as measured at 60 degrees by a gloss meter.

These and other embodiments are discussed below with reference to FIGS. 1-17. However, those skilled in the art will readily appreciate that the detailed description given herein with respect to these figures is for explanatory purposes only and should not be construed as limiting.

FIG. 1 illustrates various portable devices that may be processed using the techniques as described herein. The techniques as described herein can be used to process metallic surfaces (e.g., titanium substrate, titanium alloy substrate, etc.) of enclosures of portable electronic devices. FIG. 1 illustrates a smartphone 102, a tablet computer 104, a smartwatch 106, and a portable computer 108. According to some embodiments, the metallic surfaces can refer to a metal substrate that is capable of being anodized. In some examples, the metal substrate can include a titanium substrate, a titanium alloy substrate, a hafnium substrate, a zirconium substrate, and the like. In particular, the metal substrate can refer to a titanium or titanium alloy substrate. Titanium and its alloys thereof are characterized as having a high specific strength and stiffness, which makes titanium an attractive choice for the enclosures of the exemplary portable electronic devices described herein. For example, titanium has a Vickers hardness number of ~350 HV1. Thus, titanium can function as a protective coating to protect internal operational components carried by the enclosures, for example, when these portable electronic devices are dropped, scratched, chipped, or abraded. However, due to this hardness, it is also difficult to polish and/or machine the surface of the titanium substrate using conventional techniques. Indeed, the relative hardness of titanium relative to other metals allows for only a limited amount of roughening using conventional techniques, thereby imparting a relatively high-gloss finish that is highly reflective and may be considered aesthetically unattractive for portable electronic devices. Furthermore, titanium is also highly resistant to many conventional chemical etchants and/or electrochemical surface texturing techniques. As a result, only a limited amount of roughening of the surface is possible, which leaves a relatively high-gloss finish.

Furthermore, it should be noted that titanium in contrast to other metals (e.g., anodized aluminum, etc.) is electrically conductive. Indeed, titanium and alloys thereof may provide a desirable material choice for creating electrical contacts having excellent hardness and abrasion resistance, coupled with low contact resistance and high electrical conductivity. In some examples, the titanium and the alloys thereof described herein may be used for forming electrical contacts for ports, data connectors, and contacts.

Etched Metal Part Having a Textured Surface

Figure 2C:
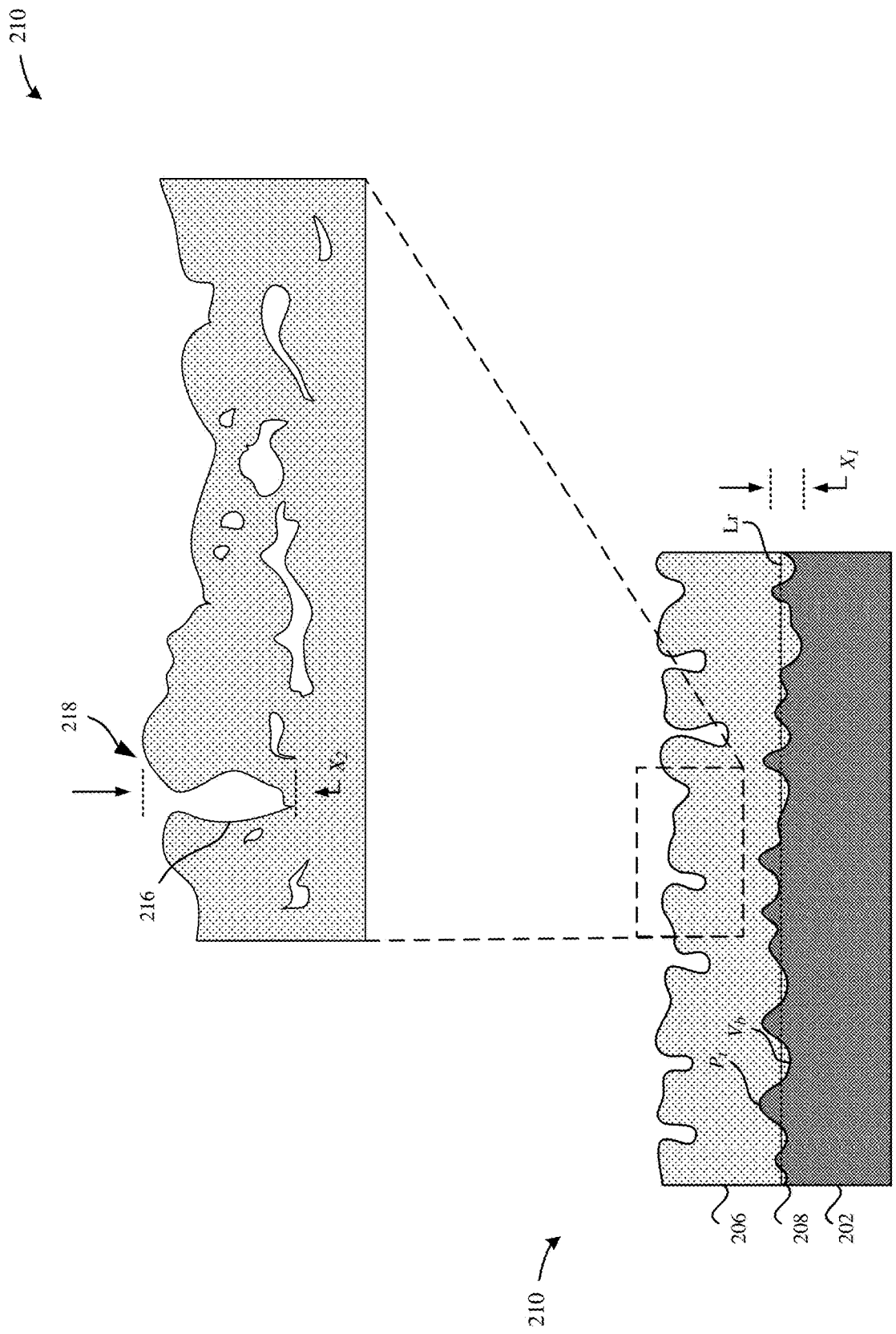

FIGS. 2A-2E illustrate cross-sectional views of a metal part undergoing a process for forming a texturized surface of the metal part, in accordance with some embodiments. FIG. 2A illustrates a metal part 200 prior to undergoing a process for forming the texturized surface. In some examples, the metal part 200 includes a metal substrate 202 that is capable of being anodized. The metal substrate 202 includes at least one of titanium, a titanium alloy, hafnium, niobium or tantalum. In some examples, the metal substrate 202 is a hard metal (e.g., Vickers hardness of 100 HV and greater).

In some embodiments, the metal substrate 202 has any thickness that is suitable for anodization, whereby the metal part 202 is exposed to an electrochemical oxidation process, as detailed with reference to FIG. 2B. In some embodiments, the metal part 200 has a near net shape of a final part, such as the enclosures of the portable electronic devices 102, 104, 106, and 108. In some examples, the external surface 204 is characterized as having a planar shape or a generally planar shape, as illustrated in FIG. 2A.

According to some embodiments, prior to the surface texturizing process, the metal substrate 202 may be subjected to a machining process in order to impart the metal substrate 202 with a final shape. Thereafter, the metal substrate 202 is wet-sanded to remove any machining marks in order to impart the external surface 204 with a fine, uniform, smooth finish. Thereafter, the external surface 204 may be optionally polished to achieve a uniform high gloss finish. In some examples, the gloss measurements of the external surface 204 subsequent to achieving the uniform high gloss finish is ~1100 gloss value at 20° degrees, ~520 gloss value at 60° degrees, and ~120 gloss value at 85° degrees According to some embodiments, prior to the surface texturizing process, the metal substrate 202 may be subjected to a blasting operation in order to achieve a uniform roughness for the external surface 204. In some examples, the blasting operation includes subjecting the external surface 204 with 45-90 micron spherical zirconia blast media at ~0.15 MPa. As a result of the blasting operation, the external surface 204 has a relatively high gloss finish, such as ~0.2 gloss value at 20° degrees, ~4 gloss value at 60° degrees, and ~9 gloss value at 85° degrees. It should be noted, as understood by one of ordinary skill in the art, these aforementioned gloss values are still relatively high and are, therefore, unsuitable for achieving a cosmetically attractive surface finish for portable electronic devices.

FIG. 2B illustrates an oxidized metal part 210 subsequent to undergoing an electrochemical oxidation process in order to roughen and/or texturize the external surface 204 of the metal substrate 202. In accordance with some embodiments, the metal substrate 202 is subject to a high voltage anodizing process also referred to as a plasma electrolytic oxidation (PEO) or micro arc oxidation (MAO). As a result, a metal oxide layer 206 is formed from the metal substrate 202. The metal oxide layer 206 overlays the metal substrate 202. In some examples, the metal oxide layer 206 includes a combination of at least one of an oxide, phosphate, silicate, aluminate or titanate, vandate, tungstae or molybdate coating. In some examples, the metal oxide layer 206 has a thickness between about 1 nm to about 50 nm.

The electrochemical oxidation process employs higher electrical potential than anodization. During the electrochemical oxidation process, the metal substrate 202 is oxidized to form an oxide layer. Plasma discharge events occur throughout the oxide layer, which modifies the structure of the oxide layer, thereby forming the metal oxide layer 206. The metal oxide layer 206 is characterized as having a crystalline microstructure. Additionally, the metal oxide layer 206 may also be characterized as a dielectric.

As a result of the electrochemical oxidation process, external surface 204 of the metal substrate 202 can have a surface roughness defined as an average of vertical deviations from nominal surface over a specified length surface. More specifically, the vertical deviations from the nominal surface can include positive vertical deviations in the form of peaks that alternate with negative vertical deviations in the form of valleys (also referred to as troughs). In some examples, the alternating peaks 214 and valleys 212 may be randomly distributed or evenly distributed from each other. For example, a masking process may be utilized to control where the alternating peaks 214 and valleys 212 are formed along the external surface 204 during the electrochemical oxidation process. In some examples, the alternating peaks 214 and valleys 212 define a ridge. The electrochemical oxidation process causes plasma discharge events at the micron-scale to form throughout the metal oxide layer 206 in proximity to the external surface 204. Each plasma discharge event roughens the external surface 204 in a controlled manner that results in fine-scale roughness of the external surface 204 that forms the alternating peaks 214 and valleys 212. As understood by one of ordinary skill in the art, the metal substrate 202 may be a hard, anodizable metal such as titanium or an alloy thereof. As a result, the alternating peaks 214 and valleys 212 illustrated in FIG. 2B are generally impossible to achieve using conventional machining and/or chemical etchant processes. Indeed, most machining operations are large-scale operations that at best, process a metal surface at a scale of tens of microns. However, the plasma discharge events cause formation of craters within the metal oxide layer 206 that that form the alternating peaks 214 and valleys 212 at the external surface 204 at the individual micron scale.

In some examples, a rough interface 208 is disposed between the metal oxide layer 206 and the metal substrate 202. In some examples, the rough interface 208 is characterized as having a surface that corresponds to the peaks 214 and valleys 212 of the metal substrate 202 as modified by the electrochemical oxidation process. According to some examples, the rough interface 208 has a surface roughness between about 1 µm to about 10 µm.

As illustrated in FIG. 2B, the metal oxide layer 206 is caused by the electrochemical oxidation process. In particular, the electrochemical oxidation process involves creating plasma discharge events that result in converting any metal oxide material formed by the oxidation process into a ceramic material having a crystalline structure. The ceramic material of the metal oxide layer 206 may be characterized as having an opaque color with a Vickers hardness value of about 2000 HV. While the metal oxide layer 206 may be of interest for surfaces of the portable electronic devices 102, 104, 106, 108, the metal oxide layer 206 may be characterized as brittle and susceptible abrasion, chipping, and staining. Furthermore, the resulting metal oxide layer 206 is generally limited in the range and control of colors that it may be dyed unlike other metals (e.g., anodized aluminum, etc.).

FIG. 2C illustrates a magnified cross-sectional view of the oxidized metal part 210 subsequent to undergoing an electrochemical oxidation process in order to roughen and/or texturize the external surface 204, as illustrated with reference to FIG. 2B in accordance with some embodiments. As illustrated in FIG. 2C, the alternating peaks 214 and valleys 212 may be randomly distributed from each other. The tops ($P_t$) of the peaks 214 may have varied heights, and the bottoms ($V_b$) of the valleys 212 may have varied depths that are formed as a result of the plasma discharge events. Each plasma discharge event roughens the external surface 204 of the metal substrate 202 in a controlled manner that results in fine-scale roughness of the external surface 204 that forms the alternating peaks 214 and valleys 212. As illustrated in FIG. 2C, the tops ($P_t$) of the peaks 214 and the bottoms ($V_b$) of the valleys 212 are characterized as having an amplitude range ($X_1$). In some examples, the amplitude range ($X_1$) is between about 3 µm to about 7 µm.

According to some examples, the tops ($P_t$) of the peaks 214 may be rounded (i.e., not pointed) caused by preferential anodization of the peaks 214 relative to the valleys 212 during the electrochemical oxidation process in conjunction with forming the metal oxide layer 206. As a result, on average, the vertical distance of the tops ($P_t$) of the peaks 214 relative to a reference line ($L_r$) may be greater than the vertical distance of the bottoms ($V_b$) of the valleys 212 relative to the reference line ($L_r$). In some examples, the reference line ($L_r$) may correspond to an average distance between the peaks 214 and the valleys 212.

As illustrated in FIG. 2C, the metal oxide layer 206 includes pore structures 216. The pore structures 216 are defined by the impact zones 218, and the impact zones 218 are generally elongated spherical shapes that extend through a portion of the metal oxide layer 206 and towards the metal substrate 202. In particular, the pore structures 216 have diameters between about 5 µm-10 µm. As a result, the metal oxide layer 206 of the oxidized metal part 210 has a surface roughness that is different from the rough interface 208. In contrast to generally columnar and/or parallel pore structures of anodized metal (e.g., anodized aluminum, etc.), the impact zones 218 have generally elongated spherical shapes. In some examples, the pore structures 216 may also be characterized as being amorphous. In particular, the impact zones 218 are formed as a result of melted ceramic material. As used herein, the term elongated spherical shape may refer to an elongated shape having a greater height than width. Additionally, the elongated spherical shape has generally curved sides that bow outwards along the center of the elongated spherical shape. According to some examples, the impact zones 218 are characterized as having an amplitude range ($X_2$). In some examples, the amplitude range ($X_2$) is <0.2 micrometers.

According to some examples, the metal oxide layer 206 has a ceramic finish and/or structure. In particular, the electrochemical oxidation process is a high-voltage anodization process that melts metal oxide material subsequently to the metal oxide material being formed. In some examples, the ceramic finish has a low gloss finish and is in muted black, brown, and/or grey colors.

FIG. 2D illustrates a cross-sectional view of a texturized metal part subsequent to applying a chemical stripping process, in accordance with some embodiments. As understood by one of ordinary skill in the art, the metal oxide layer 206 is formed from the metal substrate 202. As a result, the metal oxide layer 206 is securely adhered to the metal substrate 202, but the metal oxide layer 206 may be removed by the chemical stripping process. In accordance with some embodiments, the chemical stripping process includes exposing the oxidized metal part 210 to a stripping solution to form a texturized metal part 230. In particular, the stripping solution includes a hot sulfuric acid solution (70-90% concentration @ 70° C.-90° C.) or a hot phosphoric acid solution (50%-80% concentration @ 70° C.-90° C.). In some examples, the stripping solution is applied for ~5-15 minutes. As a result of the chemical stripping process, the metal oxide layer 206 is completely removed from the surface of the metal part 202 such as to reveal the alternating peaks 214 and valleys 212. The underlying surface finish of the texturized metal part 230 is unique to the electrochemical oxidation process (as described with reference to FIGS. 2B-2C) and the chemical stripping process. In some examples, the alternating peaks 214 and valleys 212 of the texturized metal part 230 is characterized as a low gloss, matte surface finish that is ideal for enclosures for the portable electronic devices 102, 104, 106, 108.

Beneficially, because titanium or alloys thereof is generally resistant to chemical etching, exposure of the oxidized metal part 210 to the stripping solution has no appreciable impact on altering the characteristics of the alternating peaks 214 and valleys 212. In particular, the size, shape, distribution, and/or geometry of the peaks 214 and the valleys 212 is maintained subsequent to exposing the oxidized metal part 210 to the stripping solution. Additionally, the tops ($P_t$) of the peaks 214 and the bottoms ($V_b$) of the valleys 212 may also not be affected by the stripping solution. As would be understood to one of ordinary skill in the art, if other metals having less resistance to chemical etching (e.g., aluminum, stainless steel, etc.) were anodized to form the metal oxide layer, the surface of the underlying metal substrate would be dissolved by the subsequent stripping solution. For example, a textured surface finish of an aluminum substrate having peaks and valleys would be eroded by the stripping solution. If an aluminum substrate is exposed to the stripping solution, the resulting aluminum substrate has a high-gloss surface finish. According to some embodiments, the metal oxide layer 206 cannot be separated from the metal substrate 202 in a controlled manner.

According to some embodiments, ultrasonic agitation may be utilized while exposing the oxidized metal part 210 to the chemical stripping solution in order to uniformly remove oxide material from the surface of the metal substrate 202. Indeed, the ultrasonic agitation process may yield a more controlled, more uniform process for removing the metal oxide layer 206. According to some embodiments, the exposure of the oxidized metal part 210 to the chemical stripping solution may be characterized as a self-limiting process when the metal substrate 202 includes a hard, anodizable metal that is generally resistant to chemical etching. In other words, the chemical stripping process does not progress any further into eroding away the metal substrate 202 after stripping away the metal oxide layer 206.

According to some embodiments, the metal oxide layer 206 may also be removed with a mechanical stripping process, alone or in combination with the chemical stripping process described herein. For example, the metal oxide layer 206 may be exposed to a blasting process with iron or zirconia media. The blasting process progressively chips away at the metal oxide layer 206 due to the brittle nature of the metal oxide layer 206. Thereafter, brief immersion of the metal oxide layer 206 in one of the aforementioned chemical stripping solutions may remove any embedded material and clean the external surface such as to expose the underlying metal substrate 202 having alternating peaks 214 and valleys 212.

As illustrated in FIG. 2D, the alternating peaks 214 and valleys 212 are maintained subsequent to exposing the oxidized metal part 210 to the chemical stripping solution. The texturized metal part 230 includes tops ($P_t$) of the peaks 214 and bottoms ($V_b$) of the valleys 212 characterized as having an amplitude range ($X_1$) between about 3 μm to about 7 μm. As described herein, the amplitude range may also refer to an average thickness value or a maximum thickness value. As a result, the external surface 204 of the texturized metal part 230 is characterized as a generally uniform, matte surface finish. In some examples, the external surface 204 has a gloss value of x<2 at 20° degrees, x<5 at 60° degrees, and x<10 at 85° degrees. As a result, when visible light is incident at the external surface 204, the external surface 204 diffusely reflects the visible light at substantially all angles of incidence.

According to some embodiments, the texturized metal part 230 has a surface finish quantified as a "root mean square height" ($S_q$ value) of the external surface 204. The $S_q$ value represents a standard deviation of height relative to the tops ($P_t$) of the peaks 214 and bottoms ($V_b$) of the valleys 212 of the texturized metal part 230. In some examples, the $S_q$ value represents a vertical scale of the roughness of the external surface 202. According to some examples, the external surface 204 is 1 μm>$S_q$>0.3 μm. In some examples, the $S_q$ value is between about 0.7 μm-0.8 μm.

According to some embodiments, the texturized metal part 230 has a surface finish quantified as a "root mean square gradient" ($S_{dq}$ value) of the external surface 204. The $S_{dq}$ value is a surface texture parameter that correlates inversely with the reflectivity and gloss of a surface. In other words, the higher the $S_{dq}$ value, the lower the gloss surface finish. In some examples, the $S_{dq}$ value is about 0.4 μm. In some examples, the external surface 204 is between 0.1 μm to 0.5 μm.

According to some embodiments, the texturized metal part 230 has a surface finish quantified as a "auto-correlation length" ($S_{al}$ value) of the external surface 204. The $S_{al}$ value is a surface texture parameter that represents a lateral scale of the peaks 214 and the valleys 212. In some examples, the $S_{al}$ value is 8 μm. It should be noted that the $S_q$, $S_{al}$, and the $S_{dq}$ values of the surface finish of the texturized metal part 230 correspond closely to the surface finish of brushed aluminum (e.g., blasted with zirconia, etc.), as will be described in greater detail with reference to FIGS. 4-7.

FIG. 2E illustrates a cross-sectional view of a coated metal part subsequent to applying a coating process, in accordance with some embodiments. In accordance with some embodiments, a coated metal part 240 includes a coating 242 that overlays the alternating peaks 214 and valleys 212 of the metal substrate 202. The coating 242 may be applied with a physical vapor deposition (PVD) to impart a color (e.g., black, gold, etc.) to the texturized metal part 230. The coating 242 may increase the surface hardness for improved abrasion resistance. Additionally, the coating 242 may include a clear oxide or oleophobic coating to avoid fingerprint stains.

Figure 3:
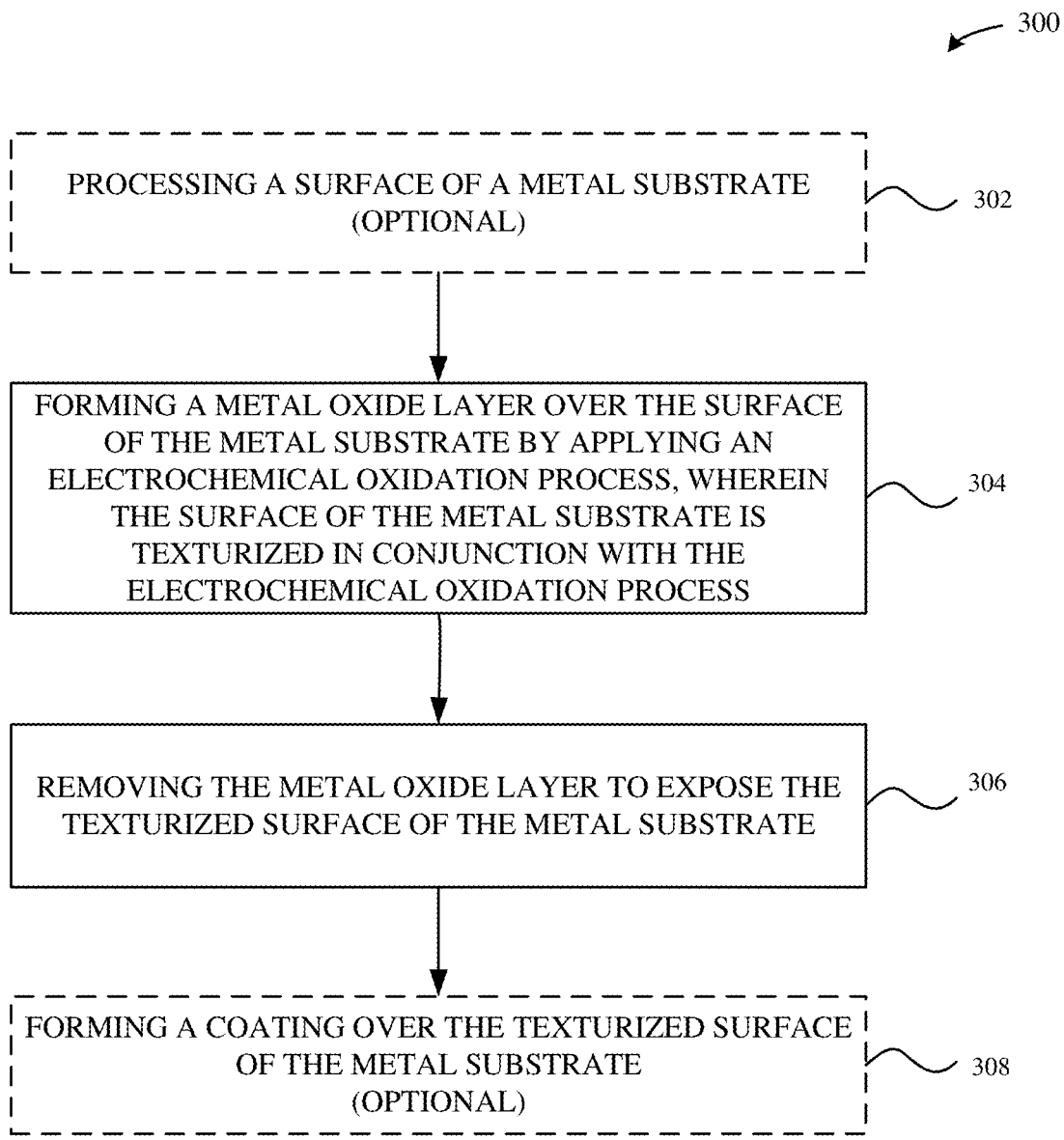
FIG. 3 illustrates a flowchart of a method for forming a texturized surface of a metal part, in accordance with some embodiments.

FIG. 3 illustrates a flowchart for a method for forming a texturized metal part, in accordance with some embodiments. In some examples, the texturized metal part—e.g., the texturized metal part 230—corresponds to the metallic surfaces of any one of the portable electronic devices 102, 104 106, or 108 described herein. As illustrated in FIG. 3, the method 300 begins at step 302 where a metal substrate 202 (e.g., titanium or alloy thereof, etc.) is subject to a processing step. In some examples, the processing step includes blasting the external surface 204 of the metal substrate 202 to form a matte surface finish and/or polishing the external surface 204 to form a high-gloss surface finish. It should be noted that the matte surface finish is still relatively high in gloss. Moreover, the high-gloss surface finish is generally cosmetically unsuitable for portable electronic devices in the consumer industry.

At step 304, a metal oxide layer 206 is formed over the surface of the metal substrate 202 by applying an electrochemical oxidation process (e.g., micro arc oxidation, etc.). In conjunction with performing the electrochemical oxidation process, the external surface 204 of the metal substrate 202 is roughened to form a texturized surface having alternating peaks 214 and valleys 212. According to some examples, the electrochemical oxidation process includes applying a high-voltage anodizing process to the metal oxide layer 206 that causes plasma discharge events. The plasma discharge events cause portions of the metal oxide layer 206 to melt, thereby resulting in a crystalline structure. The metal oxide layer 206 may have a Vickers Hardness value of about 2000 HV.

Subsequently, at step 306, the metal oxide layer 206 is removed and separated from the surface of the metal substrate 202. In particular, the metal oxide layer 206 is exposed to a chemical stripping solution (e.g., phosphoric acid, etc.) during a self-limiting removal process that is dependent upon the metal of the metal substrate 202 being resistant to chemical etching. The chemical stripping solution completely erodes away the metal oxide layer 206 but does not affect (i.e., erode) the alternating peaks 214 and valleys 212 of the metal substrate 202. By removing the metal oxide layer 206, the alternating peaks 214 and valleys 212 of the metal substrate 202 are exposed. In other words, the alternating peaks 214 and valleys 212 correspond to the external surface 204 of the metal substrate 202.

Thereafter, at step 308, a coating 242 may be optionally disposed over the alternating peaks 214 and valleys 212. The coating 242 may impart the metal substrate 202 with a non-transparent color. Additionally, the coating 242 may increase the hardness of the metal substrate 202.

Figure 4B:
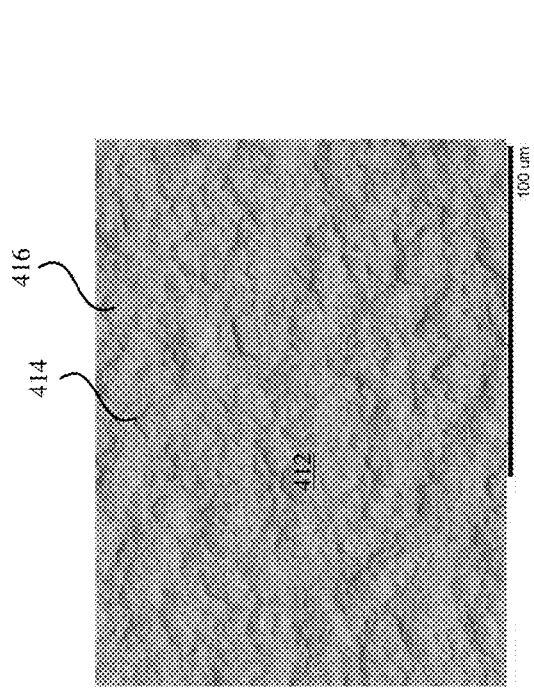
FIGS. 4A-4B illustrate exemplary images of views of metal parts, in accordance with some embodiments.
Figure 4A:
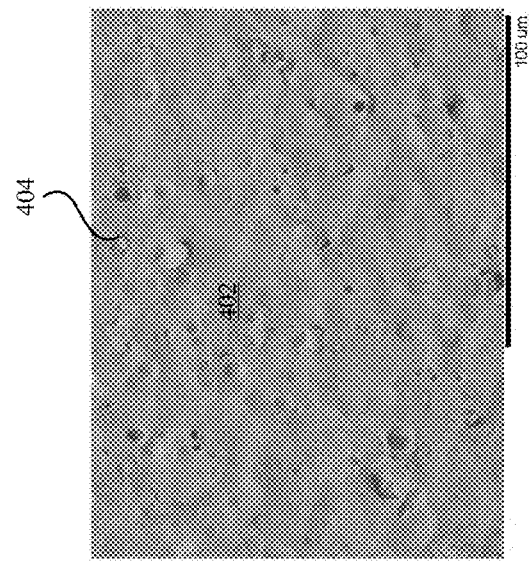

FIGS. 4A-4B illustrate top views of exemplary metal parts, in accordance with some embodiments. FIG. 4A illustrates a blasted metal part 400 that includes a titanium substrate 402. The titanium substrate 402 illustrated in FIG. 4A was processed by blasting an external surface of the titanium substrate 402 with zirconia blasting media. According to some examples, the zirconia blasting media is between about 45-90 μm in diameter. The zirconia blasting media is applied at ~0.1-~0.2 MPa (uniaxial compressive strength). As a result, the zirconia blasting media causes divots 404 to form throughout the external surface of the titanium substrate 402, thereby imparting the titanium substrate 402 with a generally uniform surface roughness. However, the divots 404 are shallow and barely penetrate the external surface. Thus, the resulting surface of the titanium substrate 402 is a relatively high gloss finish with gloss values of ~11 at 20° degrees, ~60 at 60° degrees, and ~65 at 85° degrees. Furthermore, the blasted metal part 400 has an $(S_q)$ value of ~0.2 μm and an $(S_{al})$ value of ~9 μm. In other words, the resulting surface finish of the titanium substrate 402 nowhere near resembles a typical surface finish of a blasted aluminum part having typical gloss values of ~0.2 at 20° degrees, ~4 at 60° degrees, and ~9 at 85° degrees. Accordingly, blasting a metal part (e.g., titanium, etc.) does not result in a surface finish that achieves a matte, diffuse appearance.

Contrarily, FIG. 4B illustrates a texturized metal part 410 that includes a texturized titanium substrate 412 processed using an electrochemical oxidation process that results in a texturized external surface. FIG. 4B illustrates a texturized titanium substrate 412 formed by using a high voltage anodizing process to form an overlying metal oxide layer—e.g., metal oxide layer 206—that causes alternating peaks 414 and valleys 416 to randomly form throughout the external surface of the texturized titanium substrate 412. Thereafter, the metal oxide layer is removed by a chemical stripping process that exposes the alternating peaks 414 and valleys 416. The resulting surface of the texturized titanium substrate 412 is a relatively low gloss finish with gloss values of ~0.2 at 20° degrees, ~1.7 at 60° degrees, and ~9 at 85° degrees. Furthermore, the surface finish of the texturized titanium substrate 412 offers diffuse, low gloss reflections at all angles of incidence of visible light. Furthermore, the texturized metal part 410 has an $(S_q)$ value of ~0.7 μm and an $(S_{al})$ value of ~8 μm and an $(S_{dq})$ value of ~0.4 μm.

Figures 5A, 5B:
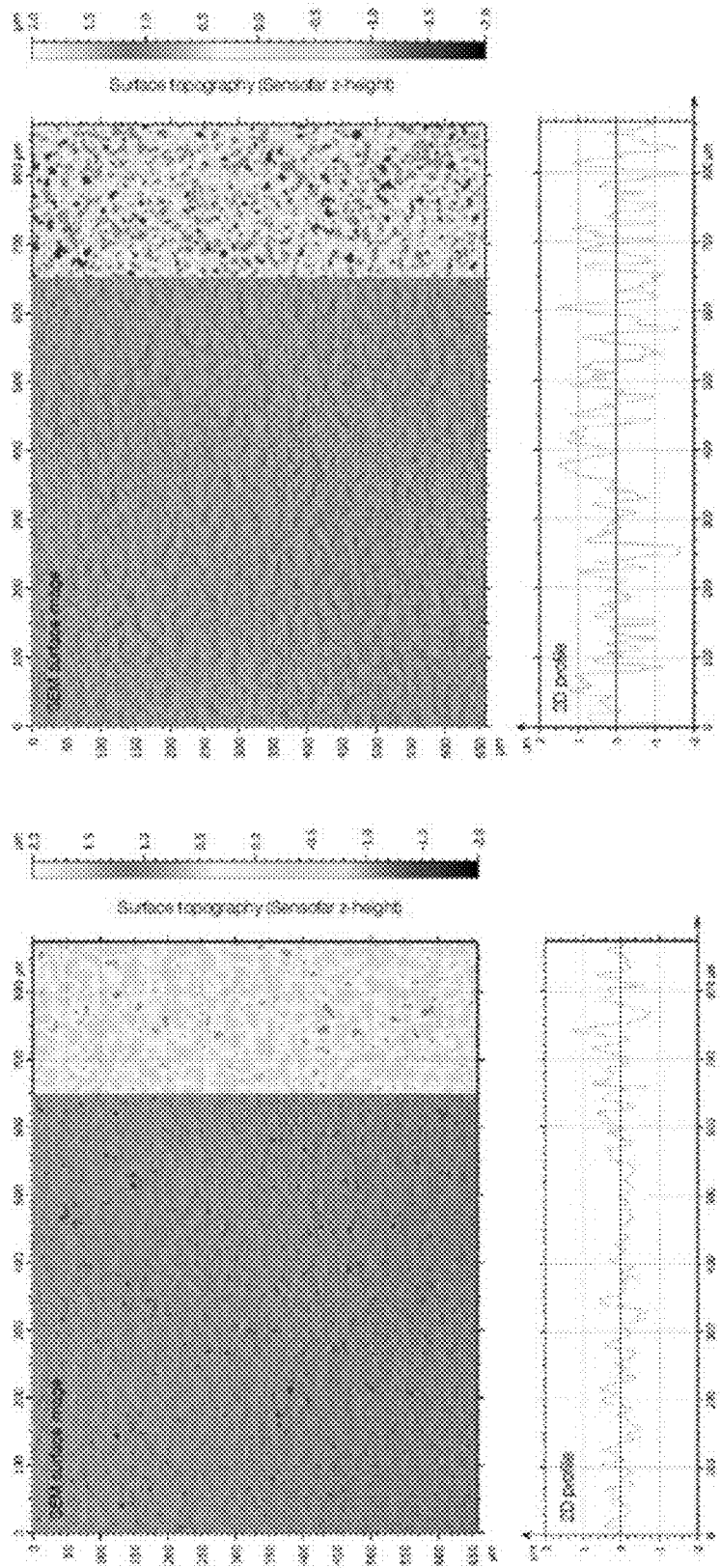
FIGS. 5A-5B illustrate exemplary electron microscope images of top views of metal parts and corresponding profile views, in accordance with some embodiments.

FIGS. 5A-5B illustrate exemplary electron microscope images of top views of metal parts and corresponding profile views, in accordance with some embodiments. FIG. 5A illustrates a blasted titanium substrate processed using a blasting process that includes blasting an external surface of the titanium substrate with zirconia blasting media (~45-90 μm spheres). As illustrated in FIG. 5A, the surface topography of the blasted titanium substrate exhibits an absence of peaks and valleys greater than or equal to about 1.5 μm. Furthermore, the corresponding 2D profile of the surface topography illustrates an amplitude of less than 1.5 μm. The blasted titanium substrate has an $(S_q)$ value of ~0.2 μm and an $(S_{al})$ value of ~9 μm.

FIG. 5B illustrates a texturized titanium substrate processed using an electrochemical oxidation process. As illustrated in FIG. 5B, the surface topography of the texturized titanium substrate exhibits peaks and valleys greater than 1.5 μm. Furthermore, the corresponding 2D profile of the surface topography illustrates an amplitude of greater than 2 μm. The texturized titanium substrate has an $(S_q)$ value of ~0.8 μm and an $(S_{al})$ value of ~8 μm.

Figure 6B:
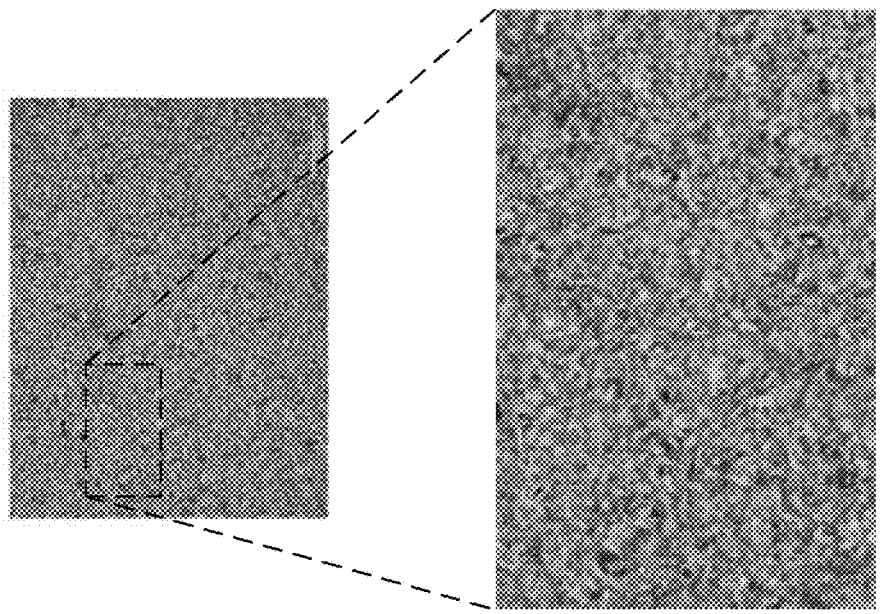
FIGS. 6A-6D illustrate exemplary images of views of metal parts, in accordance with some embodiments.
Figure 6A:
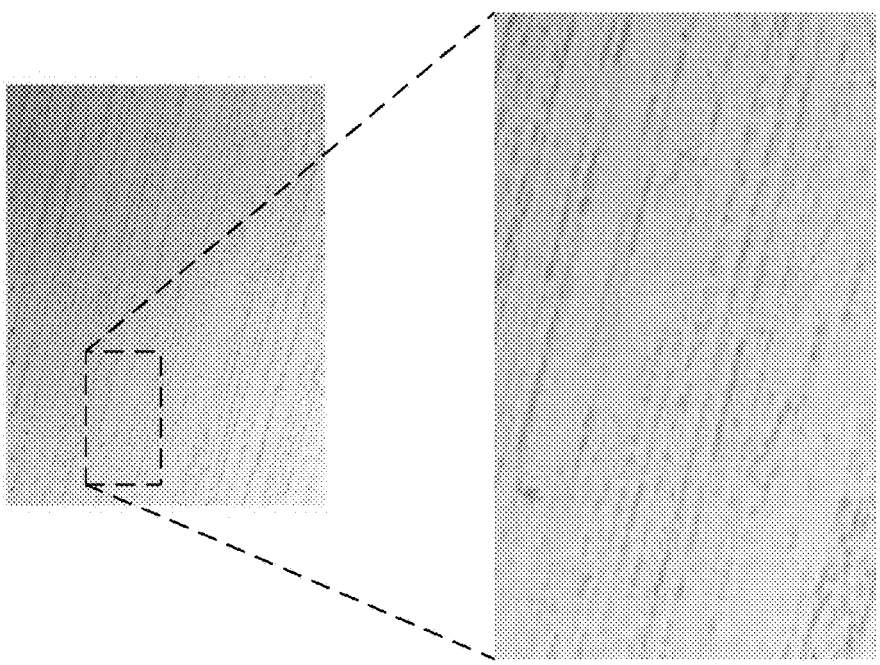

FIGS. 6A-6D illustrate exemplary electron microscope images of top views of metal parts and corresponding magnified top views, in accordance with some embodiments. FIG. 6A illustrates a polished titanium part. According to some examples, the polished titanium part has an $(S_q)$ value of ~0.007 μm and an $(S_{dq})$ value of ~0 μm. The resulting surface of the polished titanium part is a high gloss finish with gloss values of ~1200 at 20° degrees and ~552 at 60° degrees.

FIG. 6B illustrates a blasted titanium part. According to some examples, the blasted titanium part is formed by blasting an external surface of a titanium part with zirconia blasting media (~45-90 μm spheres). According to some examples, the blasted titanium part has an $(S_q)$ value of ~0.215 μm and an $(S_{dq})$ value of ~0.08 μm. The resulting surface of the blasted titanium part is a relatively high gloss finish with gloss values of ~23 at 20° degrees and ~93 at 60° degrees.

Figure 6D:
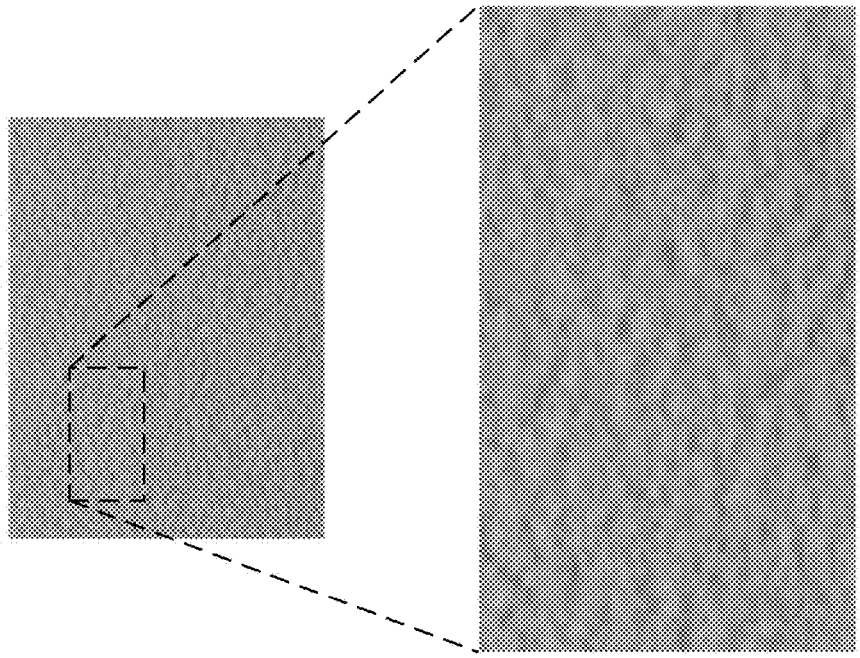
Figure 6C:
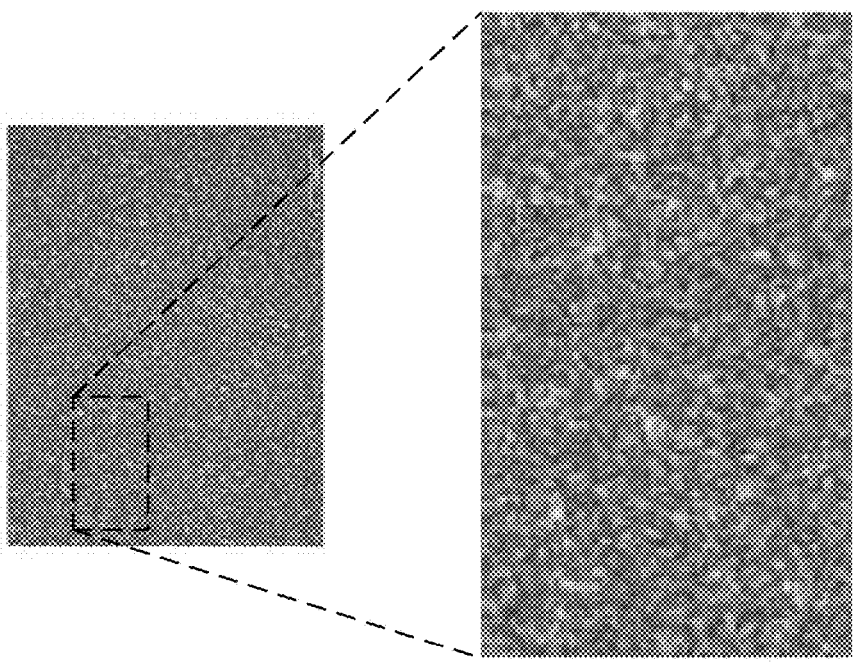

FIG. 6C illustrates a coated titanium part. According to some examples, the coated titanium part is processed by blasting a titanium part, and subsequently coating an external surface of the blasted titanium part with a physical vapor deposition (PVD) coating. According to some examples, the PVD coating imparts a color to the titanium part. According to some examples, the coated titanium part has an $(S_q)$ value of ~0.22 μm and an $(S_{al})$ value of ~6.1 μm. The resulting surface of the coated titanium part is a relatively high gloss finish with gloss values of ~7.1 at 20° degrees and ~50 at 60° degrees.

FIG. 6D illustrates a texturized titanium part. According to some examples, the texturized titanium part is processed by forming a metal oxide layer over a titanium part via an electrochemical oxidation process, and subsequently removing the metal oxide layer. According to some examples, the texturized titanium part has an $(S_q)$ value of ~0.76 μm and an $(S_{al})$ value of ~8 μm. The resulting surface of the texturized titanium part is a relatively matte, low gloss finish with gloss values of ~1.7 at 20° degrees and ~9.1 at 60° degrees.

In comparison, anodized aluminum has an $(S_q)$ value of ~0.70 μm, an $(S_{al})$ value of ~17 μm, and an $(S_{dq})$ value of ~0.15 μm. Additionally, anodized aluminum has gloss values of ~4.3 at 20° degrees and ~9.2 at 60° degrees.

Figure 7A:
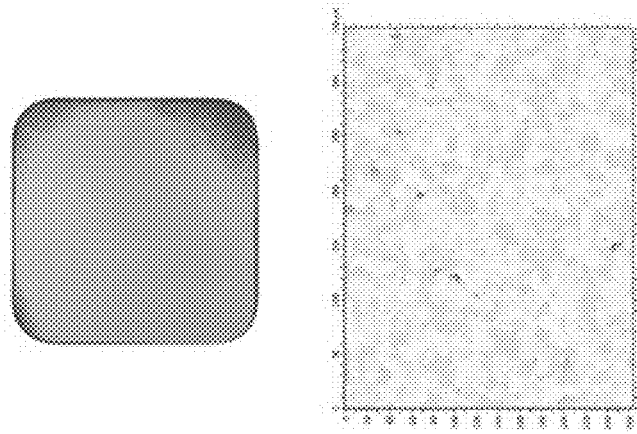
FIGS. 7A-7C illustrate exemplary images of views of metal parts indicating a relationship between processing time and extent of the texturized surface, in accordance with some embodiments.
Figure 7B:
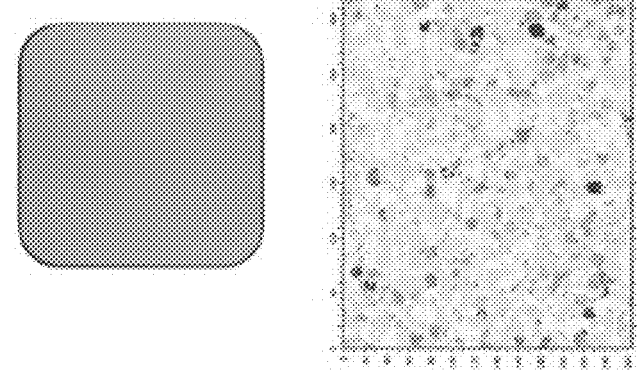
Figure 7C:
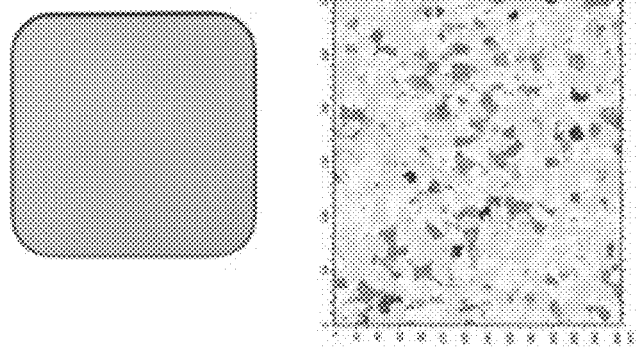

FIGS. 7A-7C illustrate exemplary electron microscope images of top views of metal oxide layers of metal parts, in accordance with some embodiments. In particular, FIGS. 7A-7C illustrate top views of metal oxide layers as a function of an amount of processing time. In some examples, the processing time may refer to an electrochemical oxidation process. The amount of time in which a metal part (e.g., titanium, etc.) is processed may control the texture of the surface of the metal oxide layer—e.g., the metal oxide layer 206—that overlays a metal substrate. Generally, the roughness of the external surface increases rapidly during the first few minutes of process (e.g., 2-10 minutes, etc.), and then more slowly as the thickness of the metal oxide layer increases. Typically, a ~5-20 nm thickness of the metal oxide layer will yield interfacial roughness on a 1-3 nm scale.

FIG. 7A illustrates an exemplary top view of a metal oxide layer of a metal part exposed to an electrochemical oxidation process for about 2 minutes. The metal oxide layer has an $(S_q)$ value of ~0.33 μm.

FIG. 7B illustrates an exemplary top view of a metal oxide layer of a metal part exposed to an electrochemical oxidation process for about 4 minutes. The metal oxide layer has an $(S_q)$ value of ~0.63 μm.

FIG. 7C illustrates an exemplary top view of a metal oxide layer of a metal part exposed to an electrochemical oxidation process for about 7 minutes. The metal oxide layer has an ($S_q$) value of ~0.66 μm.

Figure 8:
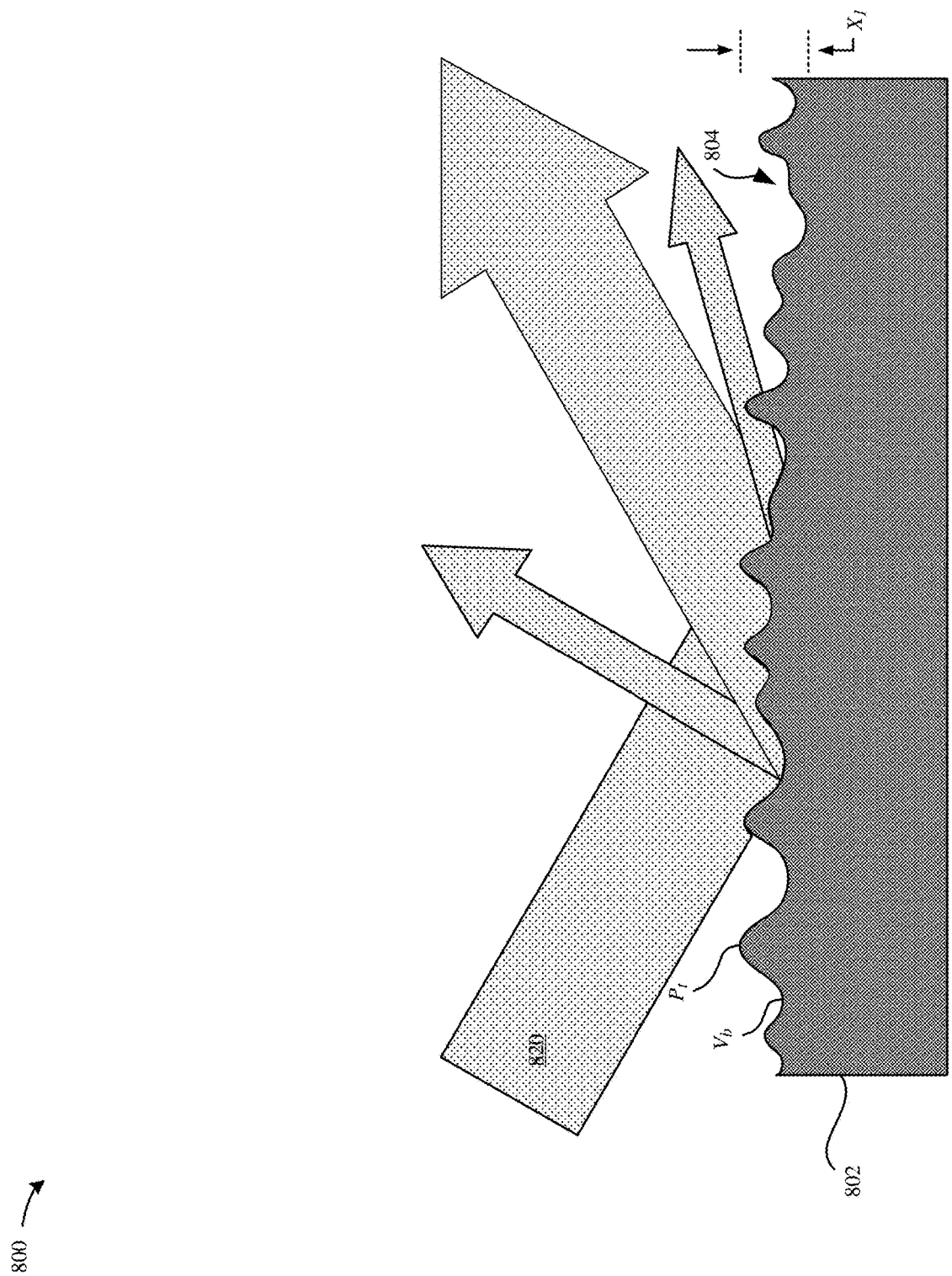
FIG. 8 illustrates an exemplary image of a cross-sectional view of a textured metal part capable of imparting diffuse reflection of visible light, in accordance with some embodiments.

FIG. 8 illustrates an exemplary image of a cross-sectional view of a textured metal part capable of imparting diffuse reflection of visible light, in accordance with some embodiments. As illustrated in FIG. 8, a texturized metal part 800 includes a metal substrate 802. In some examples, the metal substrate 802 is formed of titanium or a titanium alloy. The texturized metal part 800 includes an external surface 804 that is textured to include peaks and valleys. As illustrated in FIG. 8, the apexes of the peaks ($P_t$) are separated from troughs of the valleys ($V_b$) by a separation distance of ($X_1$). In some examples, the separation distance is between 3 μm-4 μm.

As illustrated in FIG. 8, when visible light ray 820 is incident upon the external surface 804 of the texturized metal part 800, the peaks and valleys are capable of diffusely reflecting the visible light ray into multiple light rays having different reflecting directions.

The external surface of the texturized metal part 800 has a relatively low gloss finish due to diffusive reflection of visible light. In some examples, the texturized metal part 800 has gloss values of ~0.2 at 20° degrees, ~1.7 at 60° degrees, and ~9 at 85° degrees. Furthermore, the surface finish of the texturized titanium substrate 412 offers diffuse, low gloss reflections at all angles of incidence of visible light.

Figure 9A:
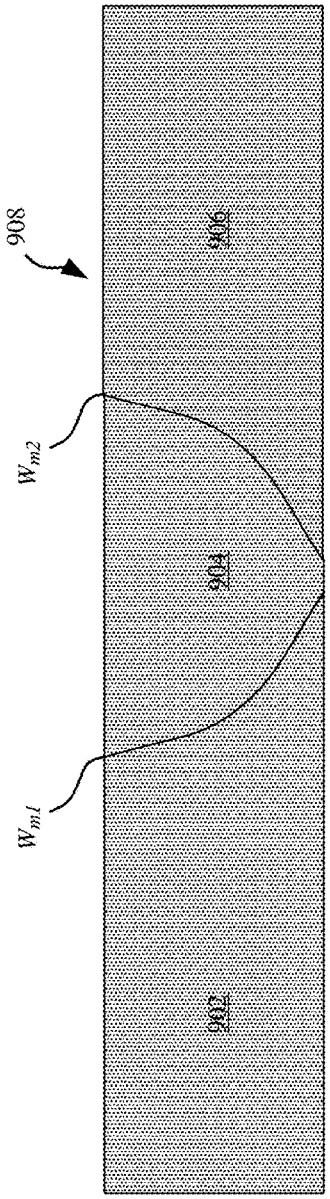
FIGS. 9A-9B illustrate exemplary cross-sectional views of welded metal parts having a non-textured surface and a textured surface, respectively, in accordance with some embodiments.
Figure 9B:
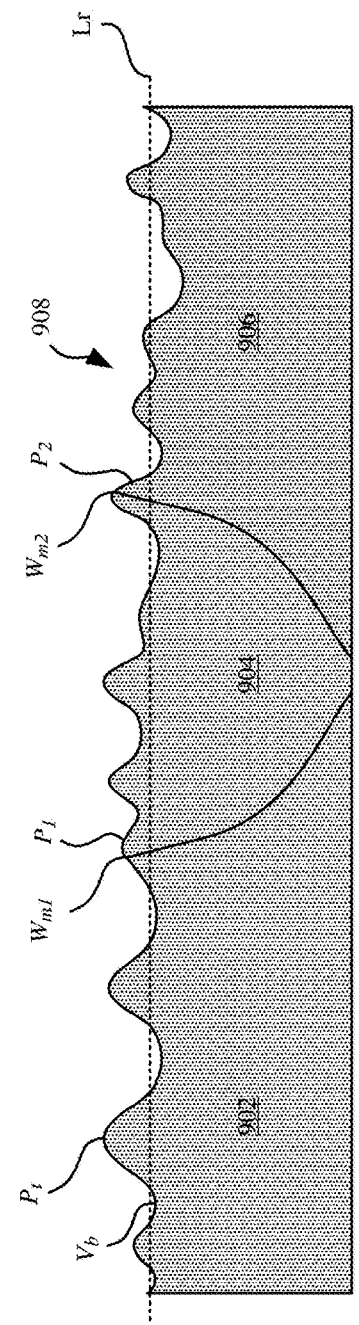

FIGS. 9A-9B illustrate exemplary cross-sectional views of welded metal parts having a non-textured surface and a textured surface, respectively, in accordance with some embodiments. In some embodiments, the metal substrate—e.g., the metal substrate 202—may be formed from multiple sections 902, 904, and 906. In some examples, the sections 902, 904, and 906 may be formed from titanium or a titanium alloy. As illustrated in FIG. 9A, a welded metal part 900 may be formed from multiple sections 902, 904, and 906 that may be laser welded or friction-stir welded together. The welded metal part 900 may include weld lines ($Wm_1$, $Wm_2$) that denote where the sections 902, 906, and 906 are welded together. Other visible physical features that indicate that the sections 902, 904, and 906 are welded together include changes in grain structure and crystallographic structure changes. While welding of different metal sections may be necessary to form enclosures of portable electronics having complex shape geometry, it may be desirable to hide or disguise presence of the weld lines ($Wm_1$, $Wm_2$) so that the enclosures appears seamless. However, only blasting of the external surface 908 of the welded metal part 900 may be insufficient to hide these weld lines.

FIG. 9B illustrates a textured welded metal part 910 subsequent to the texturizing process, as described with reference to FIGS. 2A-2E. The textured welded metal part 910 includes peaks and valleys, where apexes or tops of the peaks ($P_t$) and bottoms of the valleys ($V_b$) are separated by a separation distance that is sufficient to impart a low gloss finish when visible light is incident upon the external surface 908. The peaks and the valleys are defined by a reference line ($L_r$). In some examples, on average, the vertical distance of the tops ($P_t$) of the peaks relative to a reference line ($L_r$) may be greater than the vertical distance of the bottoms ($V_b$) of the valleys relative to the reference line ($L_r$).

As illustrated in FIG. 9B, the peak ($P_1$) overlays the weld line ($Wm_1$) such as to disguise the presence of the weld line ($Wm_1$) while the peak ($P_2$) overlays the weld line ($Wm_2$) such as to disguise the presence of the weld line ($Wm_2$). Furthermore, the peaks and valleys of the textured welded metal part 910 impart a low gloss finish that also facilitates in hiding the presence of the weld lines and differences in crystallographic grain structures.

FIGS. 10A-10B illustrate exemplary views of a welded metal part having a textured surface, in accordance with some embodiments. In particular, FIG. 10A illustrates a cross-sectional view of the textured welded metal part 910, as described with reference to FIG. 9B. FIG. 10B illustrates a top view of the external surface 908 of the textured welded metal part 910. The textured welded metal part 910 includes peaks and valleys, where tops of the peaks ($P_t$) and bottoms of the valleys ($V_b$) are separated by a separation distance that is sufficient to impart a low gloss finish when visible light is incident upon the external surface 908.

Etched Metal Part Having a Blasted Surface

Figures 11A, 11B:
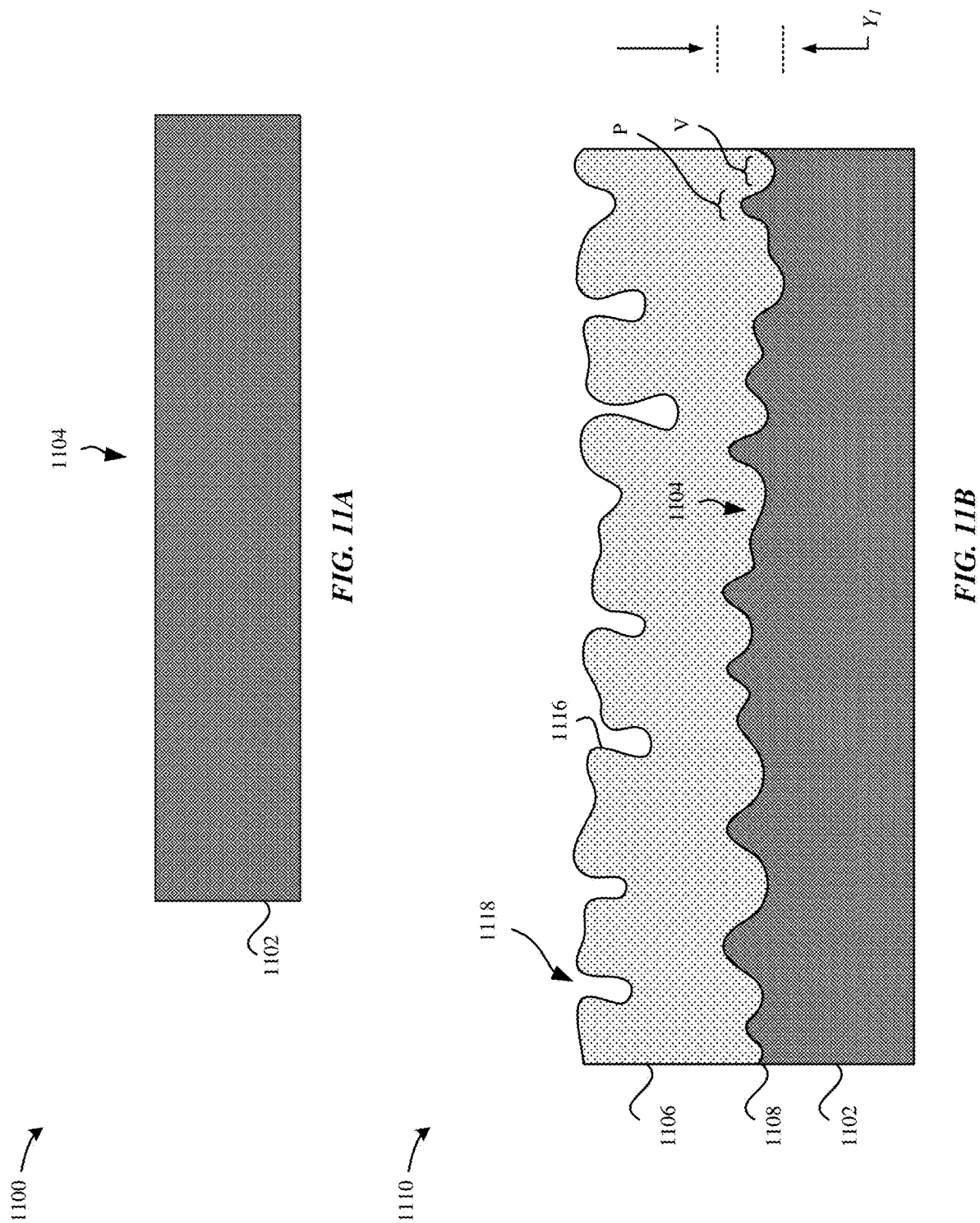

FIGS. 11A-11F illustrate cross-sectional views of a metal part undergoing a process for forming a blasted surface of the metal part, in accordance with some embodiments. FIG. 11A illustrates a metal part 1100 prior to undergoing a process for forming the blasted surface. In some examples, the metal part 1100 includes a metal substrate 1102 that is capable of being anodized. The metal substrate 1102 includes at least one of titanium, a titanium alloy, hafnium, niobium or tantalum. In some examples, the metal substrate 1102 is a hard metal (e.g., Vickers hardness of 100 HV and greater).

In some embodiments, the metal substrate 1102 has any thickness that is suitable for anodization, whereby the metal part 1102 is exposed to an electrochemical oxidation process, as detailed with reference to FIG. 11B. In some embodiments, the metal part 1100 has a near net shape of a final part, such as the enclosures of the portable electronic devices 102, 104, 106, and 108. In some examples, the metal part 1102 has an external surface 1104 characterized as having a planar shape or a generally planar shape.

According to some embodiments, prior to the surface texturizing process, the metal substrate 1102 may be subjected to a machining process in order to impart the metal substrate 1102 with a final shape. Thereafter, the metal substrate 1102 is wet—sanded to remove any machining marks in order to impart the external surface 1104 with a fine, uniform, smooth finish. According to some embodiments, prior to the surface texturizing process, the metal substrate 1102 may be subjected to a blasting operation in order to achieve a uniform roughness for the external surface 1104 and to increase a high-gloss surface finish. In some examples, it may be desirable to etch the external surface 1104 of the metal substrate 1104 to achieve greater bonding with other metal and/or composite parts while still retaining a high-gloss surface finish, as will be described with reference to FIGS. 11B-11D.

FIG. 11B illustrates an oxidized metal part 1110 subsequent to undergoing an electrochemical oxidation process in order to roughen and/or texturize the external surface 1104 of the metal substrate 1102. In accordance with some embodiments, the metal substrate 1102 is subject to a high voltage anodizing process also referred to as a plasma electrolytic oxidation (PEO) or micro arc oxidation (MAO). Plasma discharge events occur throughout the metal oxide layer 1106, which modifies the structure of the metal oxide layer 1106, thereby forming the metal oxide layer 1106. The metal oxide layer 1106 is characterized as having a crystalline microstructure. In some examples, the metal oxide layer 1106 includes a combination of at least one of an oxide, phosphate, silicate, aluminate or titanate, vandate, tungstae or molybdate coating. In some examples, the metal oxide layer 1106 has a thickness between about 20 nm to about 200 nm.

As a result of the electrochemical oxidation process, external surface 1104 of the metal substrate 1102 can have a surface roughness defined as an average of vertical deviations from nominal surface over a specified length surface. More specifically, the vertical deviations from the nominal surface can include positive vertical deviations in the form of peaks that alternate with negative vertical deviations in the form of valleys (also referred to as troughs). In some examples, the alternating peaks (P) and valleys (V) may be randomly distributed or evenly distributed from each other. The electrochemical oxidation process causes plasma discharge events at the micron—scale to form throughout the metal oxide layer 1106 in proximity to the external surface 1104. Each plasma discharge event roughens the external surface 1104 in a controlled manner that results in fine—scale roughness of the external surface 1104 that forms the alternating peaks (P) and valleys (V). In some examples, a rough interface 1108 is disposed between the metal oxide layer 1106 and the metal substrate 1102. According to some examples, the rough interface 1108 has a surface roughness between about 1 μm to about 10 μm. As illustrated in FIG. 11B, the apexes or tops ($P_t$) of the peaks and the bottoms ($V_b$) of the valleys are characterized as having an amplitude range ($Y_1$). In some examples, the amplitude range ($Y_1$) is between about 3 μm to about 7 μm. According to some examples, the tops ($P_t$) of the peaks may be rounded (i.e., not pointed) caused by preferential anodization of the peaks relative to the valleys during the electrochemical oxidation process in conjunction with forming the metal oxide layer 1106.

As illustrated in FIG. 11B, the metal oxide layer 1106 includes pore structures 1116. The pore structures 1116 are defined by the impact zones 1118, and the impact zones 1118 are generally elongated spherical shapes that extend through a portion of the metal oxide layer 1106 and towards the metal substrate 1102. In particular, the pore structures 1116 have diameters between about 5 μm-10 μm. In contrast to generally columnar and/or parallel pore structures of anodized metal (e.g., anodized aluminum, etc.), the impact zones 1118 have generally elongated spherical shapes. In some examples, the pore structures 1116 may also be characterized as being amorphous. In particular, the impact zones 1118 are formed as a result of melted ceramic material. As used herein, the term elongated spherical shape may refer to an elongated shape having a greater height than width. Additionally, the elongated spherical shape has generally curved sides that bow outwards along the center of the elongated spherical shape.

As understood by one of ordinary skill in the art, the metal substrate 1102 may be a hard, anodizable metal such as titanium or an alloy thereof. It should be noted that the alternating peaks and valleys are generally impossible to achieve using conventional machining and/or chemical etchant processes of titanium or alloys thereof. Indeed, most machining operations are large-scale operations that at best, process a metal surface at a scale of tens of microns.

As illustrated in FIG. 11B, the metal oxide layer 1106 is caused by the electrochemical oxidation process. In particular, the electrochemical oxidation process involves creating plasma discharge events that result in converting any metal oxide material formed by the oxidation process into a ceramic material having a crystalline structure. The ceramic material of the metal oxide layer 1106 may be characterized as having an opaque color with a Vickers hardness value of about 2000 HV. While the metal oxide layer 1106 may be of interest for surfaces of the portable electronic devices 102, 104, 106, 108, the metal oxide layer 1106 may be characterized as brittle and susceptible abrasion, chipping, and staining. Furthermore, the resulting metal oxide layer 206 is generally limited in the range and control of colors that it may be dyed unlike other metals (e.g., anodized aluminum, etc.).

FIG. 11C illustrates a cross-sectional view of a texturized metal part 1120 subsequent to applying a chemical stripping process and prior to applying a blasting process, in accordance with some embodiments. As understood by one of ordinary skill in the art, although the metal oxide layer 1106 may be adhered to the metal substrate 1102, the metal oxide layer 1106 can be removed using the chemical stripping process. In accordance with some embodiments, the chemical stripping process includes exposing the oxidized metal part 1110 to a stripping solution to form the texturized metal part 1120.

In particular, the stripping solution includes a hot sulfuric acid solution (70-90% concentration @ 70° C.-90° C.) or a hot phosphoric acid solution (50%-80% concentration @ 70° C.-90° C.). In some examples, the stripping solution is applied for ~5-15 minutes. As a result of the chemical stripping process, the metal oxide layer 1106 is completely removed from the surface of the metal substrate 1102 such as to reveal the alternating peaks and valleys. The underlying surface finish of the texturized metal part 1120 is unique to the electrochemical oxidation process and characterized as a low gloss, matte surface finish.

As illustrated in FIG. 11C, the tops ($P_t$) of the peaks and the bottoms ($V_b$) of the valleys are characterized as having an amplitude range ($Y_1$). In some examples, the amplitude range ($Y_1$) is between about 3 μm to about 7 μm. In other words, the chemical stripping process does not generally affect the shape and/or size of the peaks and the valleys.

FIG. 11D illustrates a cross-sectional view of a blasted metal part 1130 subsequent to a blasting process, in accordance with some embodiments. FIG. 11D illustrates a removal line (SL) that denotes different regions of the peaks and valleys that were mechanically removed subsequent to the blasting process. In some examples, the amount of the regions of the peaks and valleys that is removed according to the removal line (SL) is based on at least one of a duration, intensity, size of blasting particles that are utilized during the blasting process. In some instances, it may be desirable to remove a greater amount of the peaks relative to the valleys in order to achieve a smoother surface having a higher gloss finish. In some examples, the blasting process including blasting the external surface 1104 of the texturized metal part 1120 with zirconia ($ZrO_2$) particles. In some examples, the blasting process involves blasting with zirconia particles at a duration between 60 seconds-90 seconds.

As illustrated in FIG. 11D, regions of the peaks and the valleys are removed subsequent to the blasting process, thereby forming removed peaks ($P_r$) and removed valleys ($V_r$). In other words, the separation distance between tops of the peaks and bottoms of the valleys is reduced subsequent to the blasting process. In some embodiments, blasting the external surface 1104 can reduce surface asperities, which tends to favor reducing a greater amount of the peaks relative to the valleys of the texturized metal part 1120. As a result, the external surface 1104 of the texturized metal part 1120 becomes more flattened. As illustrated in FIG. 11D, the tops ($P_t$) of the peaks and the bottoms ($V_b$) of the valleys are characterized as having an amplitude range ($Y_2$).

In some examples, the amplitude range ($Y_2$) is between about 2 μm to about 3 μm. The blasted metal part 1130 has an amplitude range ($Y_2$)<($Y_1$). As described herein, the amplitude range may also refer to an average thickness value or a maximum thickness value.

Beneficially, re-blasting the external surface 1104 of the texturized metal part 1120 can restore gloss and achieve a smoother surface texture that is much closer to that of a blasted titanium part that has not been subjected to the chemical striping and texturizing process described herein.

In some regards, the surface finish of the blasted metal part 1130 is comparable to a surface finish of a blasted anodized aluminum part. Relative to a conventional blasted titanium part that has not undergone the chemical stripping process described herein, the blasted metal part 1130 achieve almost identical gloss values while having deeper, more fine-scale fissures. For example, a conventional blasted titanium part has gloss values of ~28 at 20° degrees, ~120 at 60° degrees, and ~85 at 85° degrees. The blasted metal part 1130 has gloss values of ~28 at 20° degrees, ~100 at 60° degrees, and ~80 at 85° degrees. In some examples, the external surface 1104 has a gloss value of x<30 at 20° degrees, x<100 at 60° degrees, and x<80 at 85° degrees. As a result, when visible light is incident at the external surface 1104, the external surface 1104 imparts more specular reflection of the visible light. In some examples, the external surface 1104 has a gloss value that is greater than 20 gloss units as measured with a 20 degree gloss meter. In some examples, the external surface 1104 has a gloss value that is greater than 90 gloss units as measured with a 60 degree gloss meter.

According to some embodiments, the blasted metal part 1130 has a surface finish quantified as a "root mean square height" ($S_q$ value) of the external surface 1104. The $S_q$ value represents a standard deviation of height relative to the tops ($P_t$) of the peaks and bottoms ($V_b$) of the valleys of the blasted metal part 1130. In some examples, the $S_q$ value represents a vertical scale of the roughness of the external surface 1104. According to some examples, the external surface 1104 is 1 μm>$S_q$>0.5 μm. In some examples, the $S_q$ value is 0.4 μm.

According to some embodiments, the blasted metal part 1130 has a surface finish quantified as a "root mean square gradient" ($S_{dq}$ value) of the external surface 1104. The $S_{dq}$ value is a surface texture parameter that correlates inversely with the reflectivity and gloss of a surface. In other words, the higher the $S_{dq}$ value, the lower the gloss surface finish. In some examples, the $S_{dq}$ value is about 0.2 μm. In some examples, the external surface 1104 has an $S_{dq}$ value between 0.1 μm to 0.25 μm.

According to some embodiments, the blasted metal part 1130 has a surface finish quantified as a "auto-correlation length" ($S_{al}$ value) of the external surface 1104. The $S_{al}$ value is a surface texture parameter that represents a lateral scale of the peaks and the valleys. In some examples, the $S_{al}$ value is 6 μm. It should be noted that the $S_q$, $S_{al}$, and the $S_{dq}$ values of the surface finish of the texturized metal part 230 correspond closely to the surface finish of a blasted titanium part (e.g., blasted with zirconia, etc.). However, the differentiation between the blasted metal part 1130 processed using a chemical stripping process is that the blasted metal part 1130 has deeper valleys (e.g., 2-3 μm depth) and more fine-scale features.

Figure 11E:
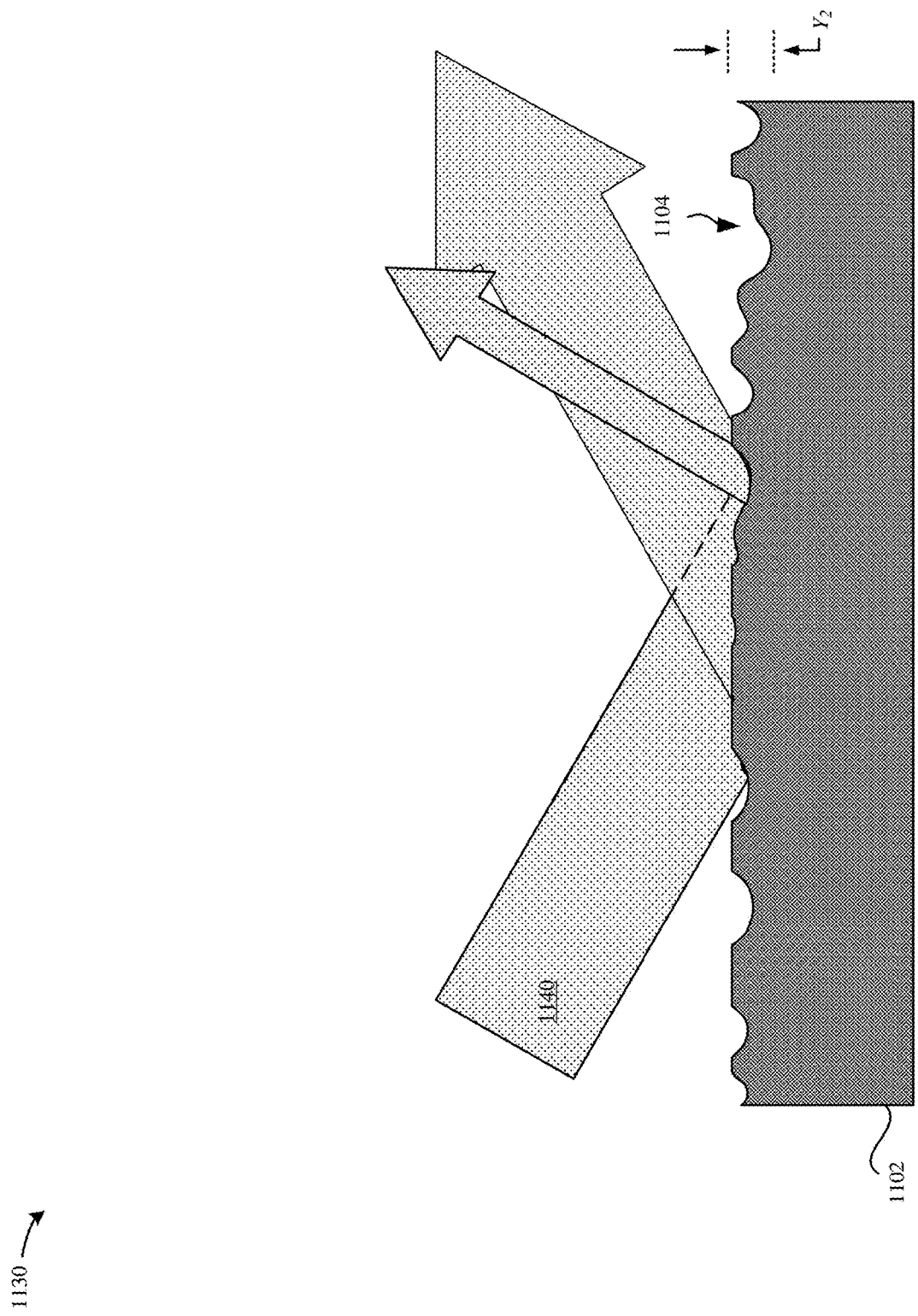

FIG. 11E illustrates an exemplary image of a cross-sectional view of the blasted metal part 1130 capable of imparting more specular reflection of visible light relative to the texturized metal part 800, in accordance with some embodiments. As illustrated in FIG. 11E, when visible light ray 1140 is incident upon the external surface 1104 of the blasted metal part 1130, the peaks and valleys are capable of imparting more diffuse, off-angle reflections of the visible light ray 1140 into multiple light rays having different reflecting directions.

Although not illustrated with reference to FIGS. 11A-11E, the blasted metal part 1130 is also capable of hiding and concealing weld lines formed by welding metal sections. For example, although the size of the peaks are reduced, the blasted metal part 1130 still retains peaks and valleys that can overlay weld lines such as to disguise the presence of the weld lines and differences in crystallographic grain structures.

Figure 12C:
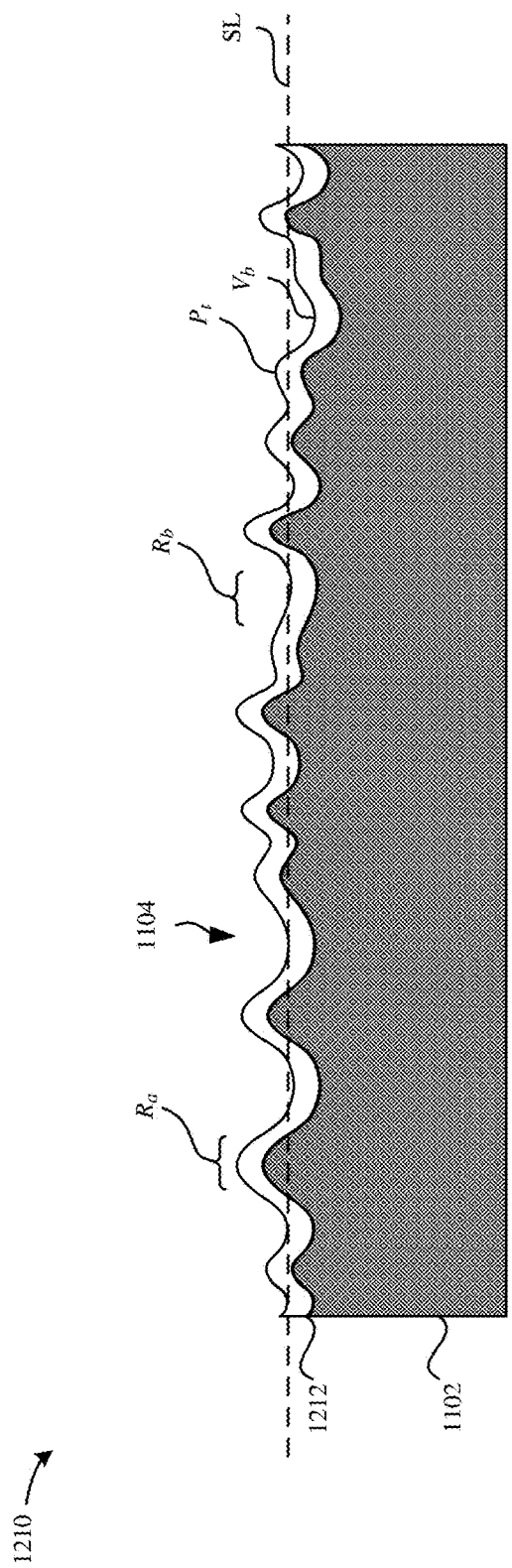

FIGS. 12A-12E illustrate cross-sectional views of a process for forming a metal part having an anodic layer, in accordance with some embodiments. According to some embodiments, the method for forming the anodic layer may be performed in conjunction with forming the texturized metal part, as described with reference to FIGS. 2A-2E and the blasted metal part, as described with reference to FIGS. 11A-11E. FIG. 12A illustrates a cross-sectional view of a texturized metal part 1200 subsequent to the chemical stripping process, as described with reference to FIG. 11C. As illustrated in FIG. 12A, the texturized metal part 1200 includes a metal substrate 1102 having peaks and valleys, where tops of the peaks ($P_t$) are separated from bottoms of the valleys ($V_b$) by a separation distance ($Y_1$).

FIG. 12B illustrates a cross-sectional view of an anodized metal part 1210 subsequent to an anodization process, in accordance with some embodiments. The texturized metal part 1200 may be exposed to an anodization process (e.g., between 25 V-35 V) that causes an anodized layer 1212 to form from the metal substrate 1102 and overlay the external surface 1104 of the texturized metal part 1200. As illustrated in FIG. 12B, the anodized layer 1212 overlays the peaks and valleys; thereby, increasing a separation distance between the tops of the peaks ($P_t$) and the bottoms of the valleys ($V_b$).

In some examples, the anodized layer 1212 includes titanium oxide or a mixed metal oxide material formed from the metal substrate 1102. The anodized layer 1212 exhibits thickness-dependent color and is between about 20 nm to about 200 nm thick. In other words, the anodized layer 1212 exhibits thin-film interference color. In some examples, the metal substrate 1102 is anodized to achieve an anodized layer 1212 having a desired color.

FIG. 12C illustrates a cross-sectional view of the anodized metal part 1210 prior to the blasting process, in accordance with some embodiments. Although the anodized layer 1212 includes an anodized layer 1212 having a thin-film interference color, it should be noted that the anodized layer 1212 may be subject to chipping or color fade as a result of ultraviolet radiation exposure. In order to improve the color retention of the anodized layer, the anodized metal part 1210 may be subject to the blasting process. Notably, the blasting process may mechanically strip portions of the anodized layer 1212 that overlay regions of the peaks while retaining portions of the anodized layer 1212 that overlay troughs of the valleys. Moreover, it should be noted that a blasting process performed on a conventionally anodized part would completely remove the anodized layer; and therefore, the thin-film interference color. Accordingly, forming an anodized layer over peaks and valleys ensures greater resistance to loss of color due to the blasting process. According to some examples, portions of the anodized layer 1212 may be disposed deep within the valleys of the external surface 1104 and difficult or impossible to remove via chemicals or mechanical means. For example, zirconia beads cannot penetrate deep enough into the valleys to reach portions of the anodized layer 1212 that overlay the valleys. The size of the zirconia beads is about 100 μm, which is greater than the size of the valleys. The valleys themselves have a fine-scale roughness (e.g., 10s of μms).

As illustrated in FIG. 12C, a removal line (SL) denotes different regions of the peaks and valleys that may be mechanically removed subsequent to the blasting process. In some examples, the amount of the regions of the peaks and valleys that is removed according to the removal line (SL) is based on at least one of a duration, intensity, size of blasting particles that are utilized during the blasting process. In some instances, it may be desirable to remove a greater amount of the peaks relative to the valleys in order to achieve a smoother surface having a higher gloss finish. In some instances, the amount of material that is removed from the peaks and the valleys is intended to achieve a desired thin-film interference color corresponding to an L*a*b* color space model. For example, a significant removal of the anodized layer 1212 that overlays the peaks and the valleys can reduce the perceived saturation of the thin-film interference color.

In some examples, the blasting process including blasting the external surface 1104 of the texturized metal part 1120 with zirconia ($ZrO_2$) particles. In some examples, the blasting process involves blasting with zirconia particles at a duration between 60 seconds-90 seconds.

Figure 12D:
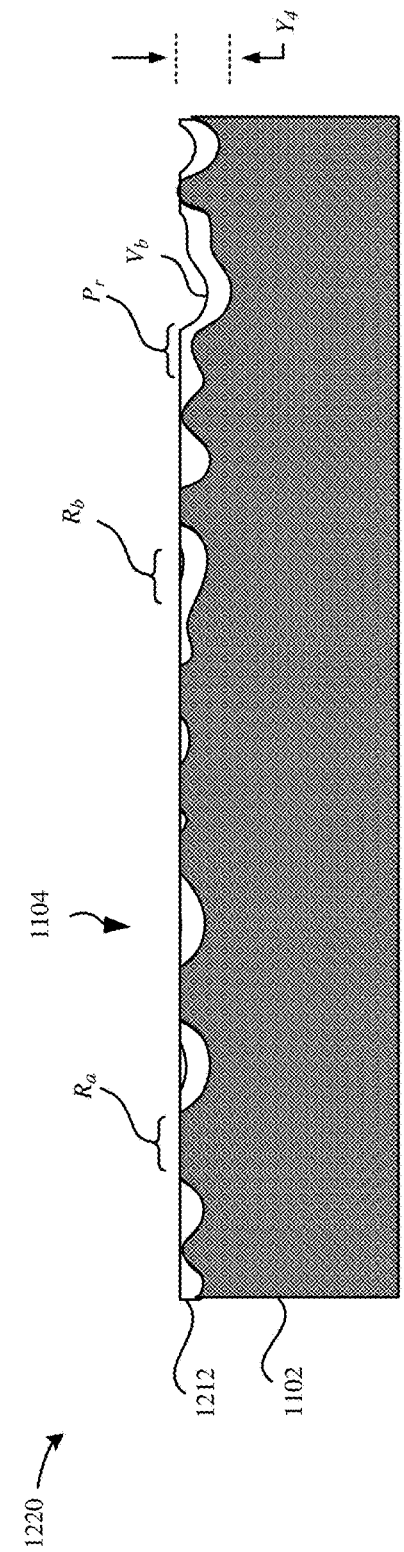

FIG. 12D illustrates a cross-sectional view of a blasted anodized part 1220 subsequent to the blasting process, in accordance with some embodiments. As illustrated in FIG. 12D, regions of the peaks and the valleys are removed subsequent to the blasting process, thereby forming removed peaks ($R_a$) and removed valleys ($R_v$). The blasting process can achieve a particular color at a fine length scale (10s of μm).

In some embodiments, blasting the external surface 1104 can reduce surface asperities, which tends to favor reducing a greater amount of the peaks relative to the valleys of the blasted anodized part 1220. As a result, the external surface 1104 of the blasted anodized part 1220 becomes more flattened so that the tops ($P_t$) of the peaks and the bottoms ($V_b$) of the valleys are characterized as having an amplitude range ($Y_4$). In some examples, the amplitude range ($Y_4$) is between about 2 μm to about 3 μm. As described herein, the amplitude range may also refer to an average thickness value or a maximum thickness value.

Notably, while blasting the external surface 1104 may disproportionately reduce a greater amount of the peaks relative to the valleys, the external surface 1104 still substantially retains the thin-film interference color prior to the blasting process. Indeed, portions of the anodized layer 1212 are retained at a very fine scale within the valleys. In other words, there may be a greater amount of the anodized layer 1212 that overlay the valleys relative to the peaks. In some examples, the anodized layer 1212 has a surface area that is less than a surface area of the external surface 1104. Beneficially, blasting the external surface 1104 can improve surface reliability during abrasion exposure. Additionally, blasting selective regions of the anodized layer 1212 can enable a manufacturer to form more intricate patterns of the anodized layer 1212 than would be otherwise possible using a conventional anodizing process.

The external surface 1104 of the blasted anodized part 1220 is characterized as a generally high-gloss surface finish. In some examples, the external surface 1104 has a gloss value (x) where: $20<x<30$ at 20° degrees, $90<x<100$ at 60° degrees, and $70<x<80$ at 85° degrees. As a result, when visible light is incident at the external surface 1104, the external surface 1104 imparts more specular reflection of the visible light.

Figure 12E:
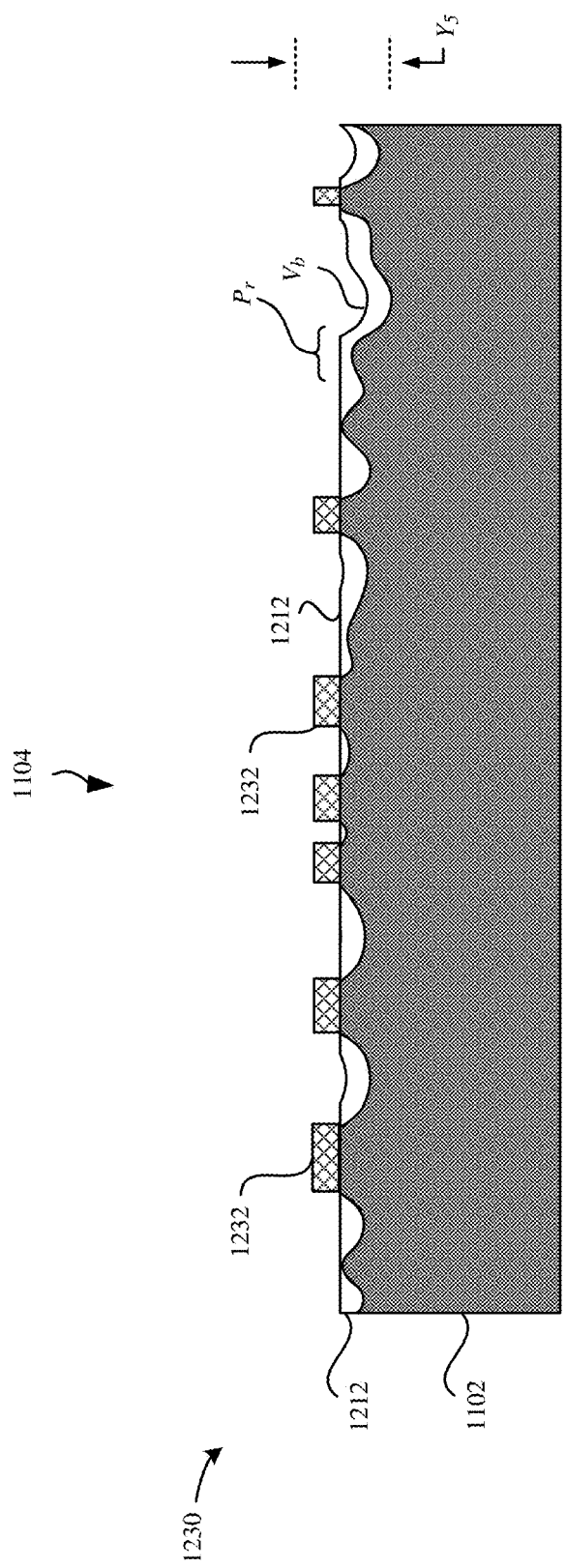

FIG. 12E illustrates a cross-sectional view of a multiple anodized part 1230 subsequent to an additional anodization process, in accordance with some embodiments. As illustrated in FIG. 12E, the blasted anodized part 1220 may be subject to an additional anodization process to form a more intricate anodized pattern. In particular, the regions of the metal substrate 1102 corresponding to the removed peaks ($R_a$) and removed valleys ($R_v$) may be subjected to the additional anodization process to form an additional anodized layer 1232. In some examples, the additional anodized layer 1232 may have a different thickness than the anodized layer 1212; thereby, imparting different thin-film interference colors. As a result, the external surface 1104 of the multiple anodized part 1230 regains some of the tops ($P_t$) of the peaks and the bottoms ($V_b$) of the valleys and is characterized as having an amplitude range ($Y_5$).

According to some embodiments, a photomask can be utilized to achieve different thin-film interference colors at different portions of the external surface 1104. For example, a mask can be utilized to form a logo or other marking. According to some embodiments, a mask can be utilized to mask off regions of the external surface 1104 intended to form the additional anodized layer 1232.

Furthermore, the blasted anodized part 1220 and the multiple anodized part 1230 are also capable of hiding or camouflaging weld lines formed along the metal substrate 1102. In particular, the growth of the anodized layer 1212 and the additional anodized layer 1232 is not sensitive to the presence of the weld lines. Additionally, the blasting process can impart a high gloss finish that also serves to hide the weld lines.

Figure 13:
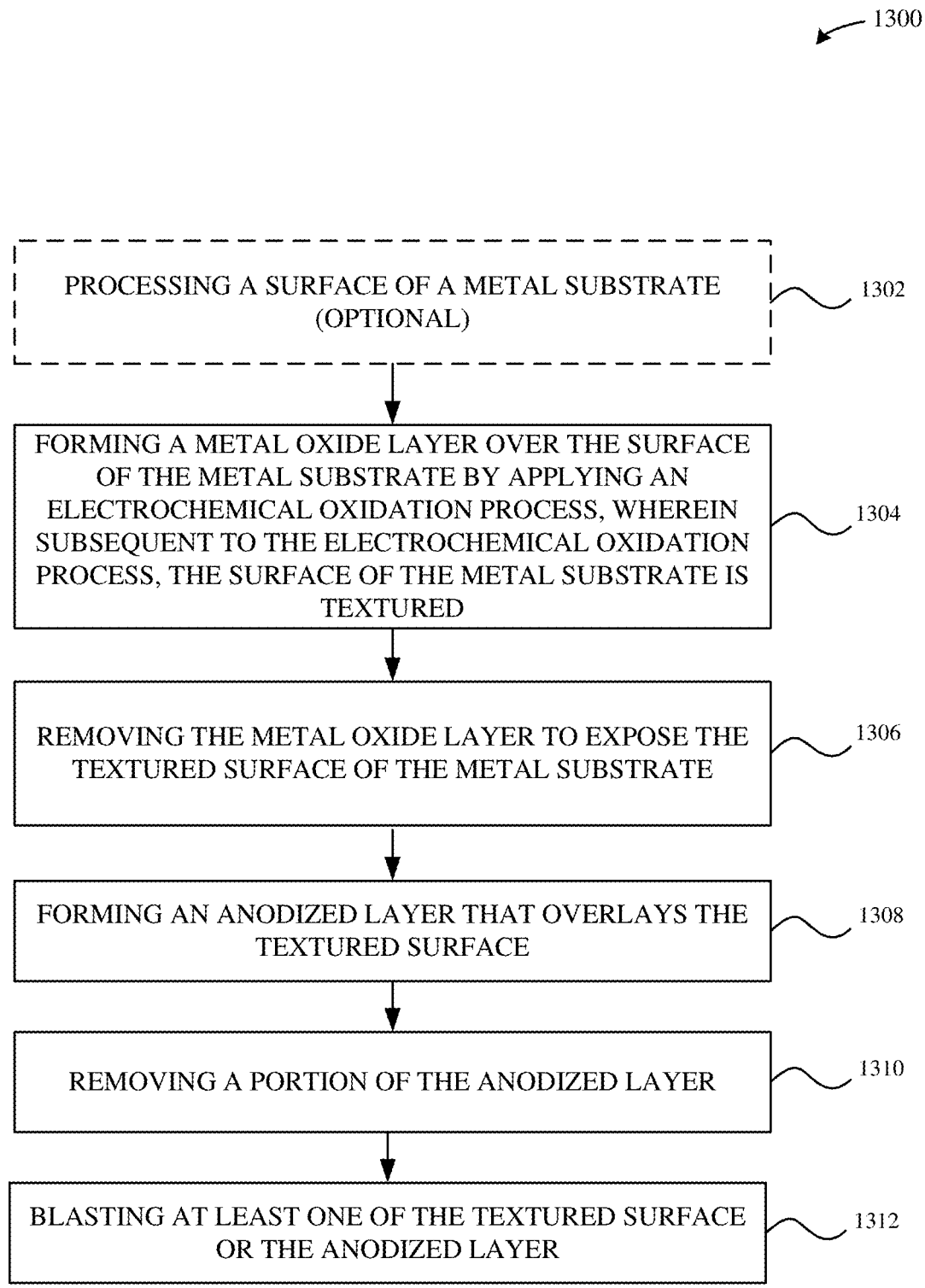
FIG. 13 illustrates a flowchart of a method for forming a metal part, in accordance with some embodiments.

FIG. 13 illustrates a flowchart for a method for forming the blasted metal part and the blasted anodized part, in accordance with some embodiments. In some examples, the blasted metal part corresponds to the blasted metal part 1130 and the blasted anodized part corresponds to the blasted anodized part 1220 or the multiple anodized part 1230, which can correspond to the metallic surfaces of any one of the portable electronic devices 102, 104 106, or 108 described herein.

As illustrated in FIG. 13, the method 1300 begins at step 1302 where a metal substrate 1102 (e.g., titanium or alloy thereof, etc.) is subject to a processing step. In some examples, the processing step includes blasting the external surface 1104 of the metal substrate 1102 to form a matte surface finish and/or polishing the external surface 1104 to form a high-gloss surface finish. It should be noted that the matte surface finish is still relatively high in gloss. Moreover, the high-gloss surface finish is generally cosmetically unsuitable for portable electronic devices in the consumer industry.

At step 1304, a metal oxide layer 1106 is formed over the surface of the metal substrate 1102 by applying an electrochemical oxidation process (e.g., micro arc oxidation, etc.). In conjunction with performing the electrochemical oxidation process, the external surface 1104 of the metal substrate 1102 is roughened to form a texturized surface having alternating peaks and valleys. According to some examples, the electrochemical oxidation process includes applying a high-voltage anodizing process to the metal oxide layer 1106 that causes plasma discharge events. The plasma discharge events cause portions of the metal oxide layer 1106 to melt, thereby resulting in a crystalline structure. The metal oxide layer 206 may have a Vickers Hardness value of about 2000 HV.

Subsequently, at step 1306, the metal oxide layer 206 is removed and separated from the surface of the metal substrate 1102. In particular, the metal oxide layer 1106 is exposed to a chemical stripping solution (e.g., phosphoric acid, etc.) during a self-limiting removal process that is dependent upon the metal of the metal substrate 1102 being resistant to chemical etching. The chemical stripping solution completely erodes away the metal oxide layer 1106 but does not affect (i.e., erode) the alternating peaks and valleys of the metal substrate 1102. By removing the metal oxide layer 1106, the alternating peaks and valleys of the metal substrate 1102 are exposed.

Thereafter, at step 1308, an anodized layer 1212 may be optionally formed over the alternating peaks and valleys. The anodized layer 1212 may impart the metal substrate 1102 with a thin-film interference color. In some examples, an optical detection system may be utilized to determine whether the anodized layer 1212 has a thickness that corresponds to a desired color. As a result of determining whether the color of the anodized layer 1212 matches to the desired color, then the anodization process may either continue or end.

At step 1310, a portion of the anodized layer 1212 may be optionally removed such as to flatten the external surface 1104. The peaks and valleys may be flattened with the peaks being disproportionately reduced relative to the valleys.

At step 1312, the external surface 1104 of the anodized metal part 1210 or the external surface 1104 of the texturized metal part 1120 may be processed using a blasting process, in accordance with some embodiments.

Figure 14:
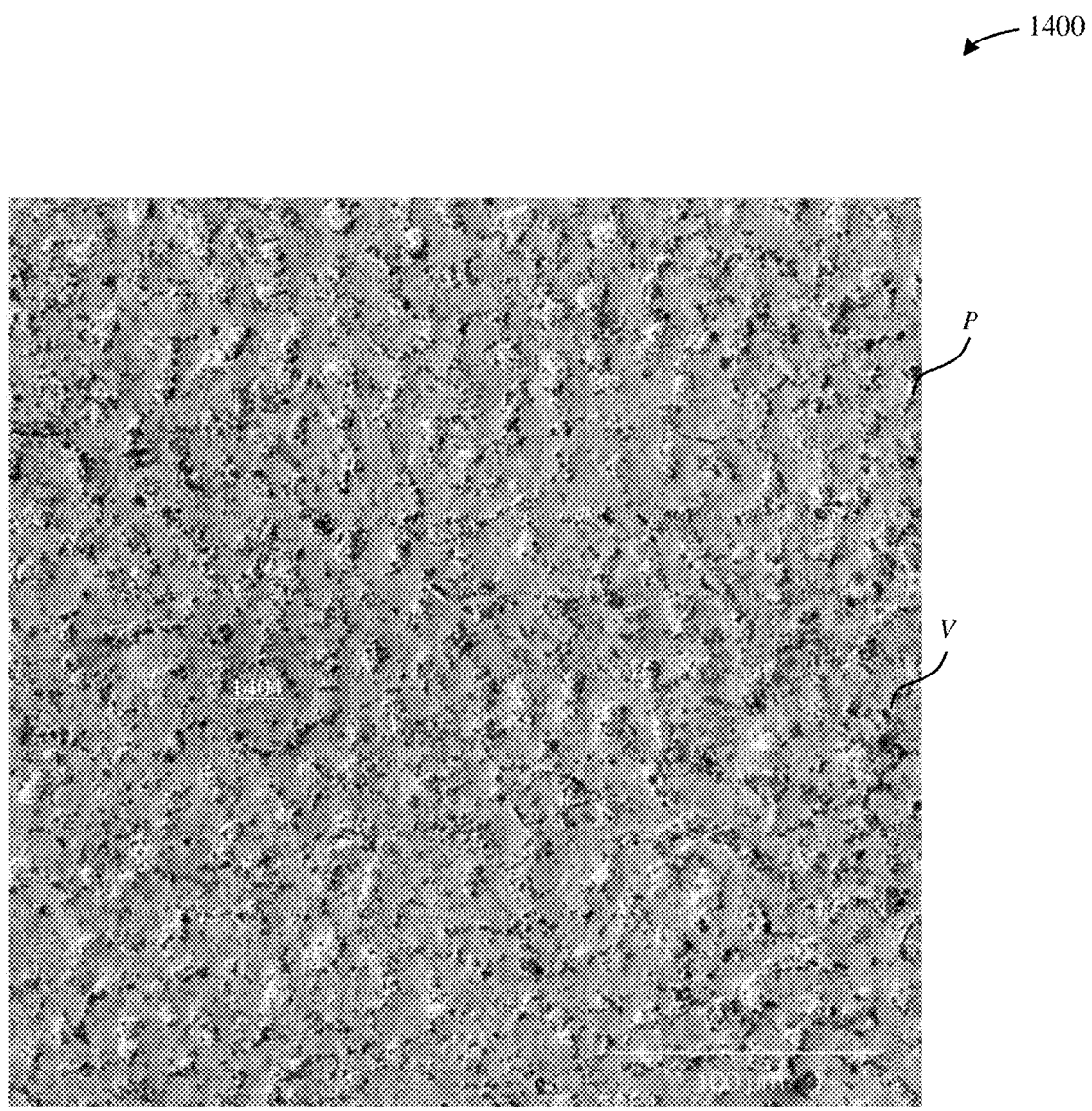
FIG. 14 illustrates an exemplary electron microscope image of a top view of a metal part having a blasted surface, in accordance with some embodiments.

FIG. 14 illustrates an exemplary electron microscope image of a top view of a blasted metal part 1400 having a blasted surface, in accordance with some embodiments. In some examples, the metal corresponds to the blasted metal part 1130, as described with reference to FIGS. 11A-11E. As illustrated in FIG. 14, the blasted metal part 1400 maintains the roughness of the peaks (P) and valleys (V) following the chemical stripping process. Beneficially, the peaks and valleys of the blasted metal can hide defects in the titanium substrate, such as weld lines and crystallographic structure differences. It should be noted that the blasting process can hide such defects, which cannot be hidden by blasting alone.

In some examples, the blasting process can result in bringing the external surface 1404 of the blasted metal part 1400 to between about 50%-70% of the original gloss of a conventionally blasted titanium part.

Figure 15:
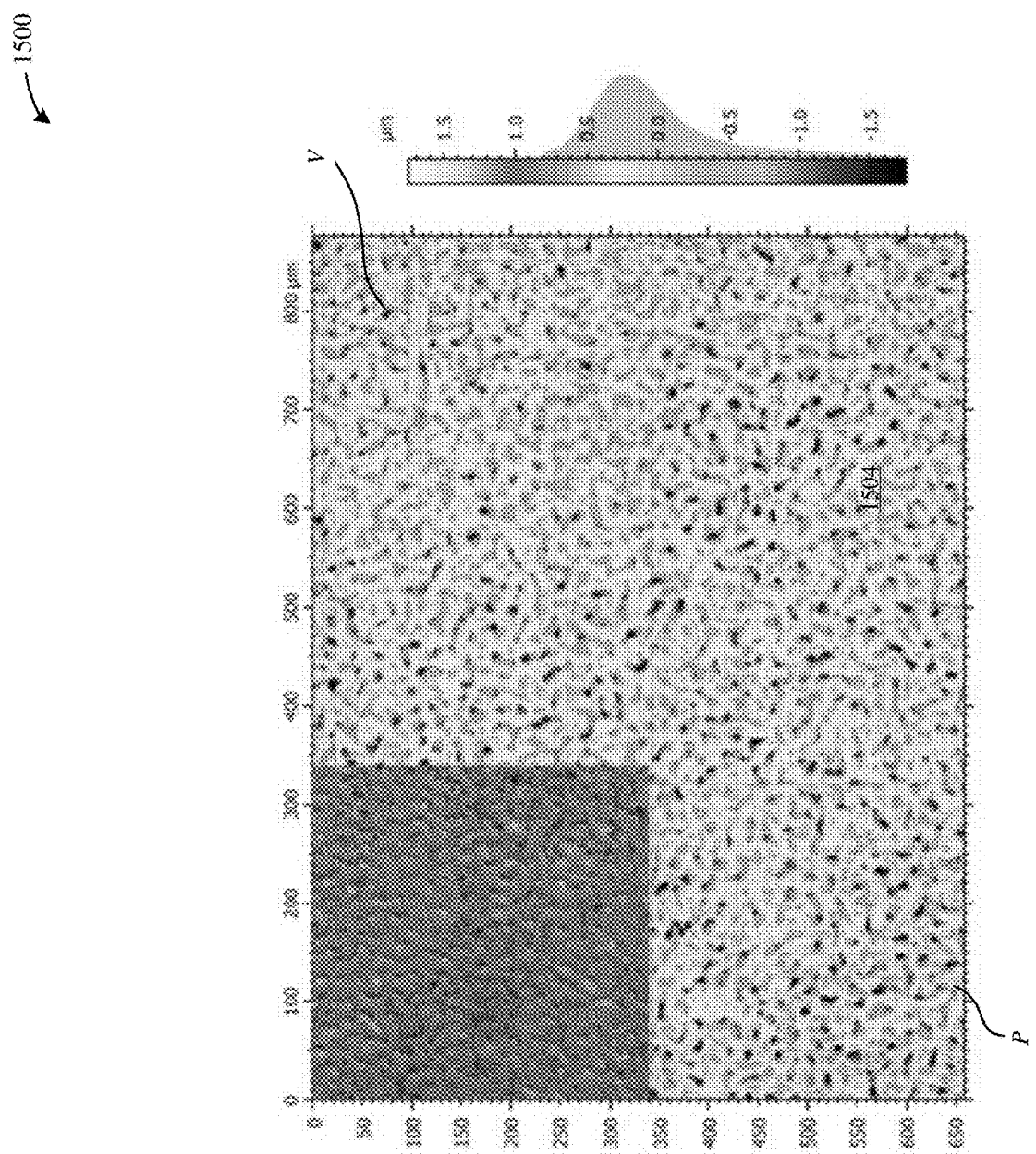
FIG. 15 illustrates an exemplary electron microscope image of a top view of a metal part having a blasted surface and a corresponding profile view, in accordance with some embodiments.

FIG. 15 illustrates an exemplary electron microscope image of a top view of a metal part having a blasted surface and a corresponding profile view, in accordance with some embodiments. The top view of the electron microscope image of the metal part shows a disproportionate amount of the valleys relative to the peaks, which is the result of the blasting process. The micro-arc oxidation process causes the average amplitude of the external surface 1104 to shift towards a greater average height (e.g., ~0.4 μm) and the blasting process causes the average height of a textured external surface 1504 of a blasted metal part—e.g., the blasted metal part 1400—to reduce to an average amplitude (e.g., ~0.35 μm). The shift in average amplitude is represented by truncated and smoothened peaks while the valleys are not as affected by the blasting process due to being recessed.

Figure 16:
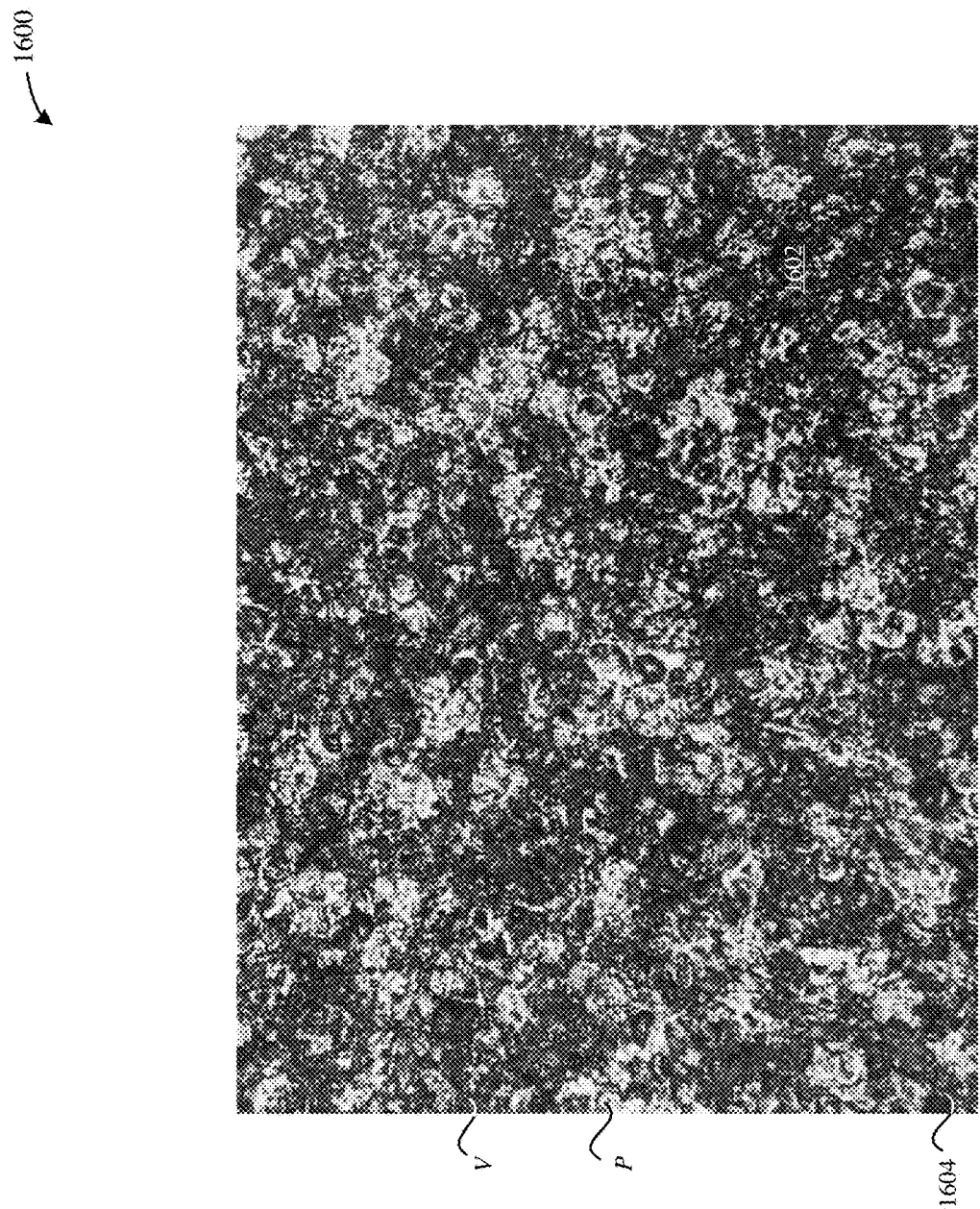
FIG. 16 illustrates an exemplary electronic microscope image of a top view of a metal part having an anodic layer, in accordance with some embodiments.

FIG. 16 illustrates an exemplary electronic microscope image of a top view of a metal part having an anodic layer, in accordance with some embodiments. FIG. 16 illustrates an exemplary electron microscope image of a blasted anodized part 1600—e.g., the blasted anodized part 1220—in accordance with some embodiments. The blasted anodized part 1600 includes an external surface 1602 having an anodized layer 1604 that overlays portions of the peaks (P) and the valleys (V). As illustrated in FIG. 16, there is a sufficient amount of the anodized layer 1604 to impart the blasted anodized part 1600 with a thin-film interference color that is resistant to abrasion. As is understood by those of ordinary skill in the art, different thin-film interference colors are imparted by the thicknesses of the anodized layer. The amplitude of the anodizing voltage may affect the thickness of the anodized layer 1212.

Figure 17:
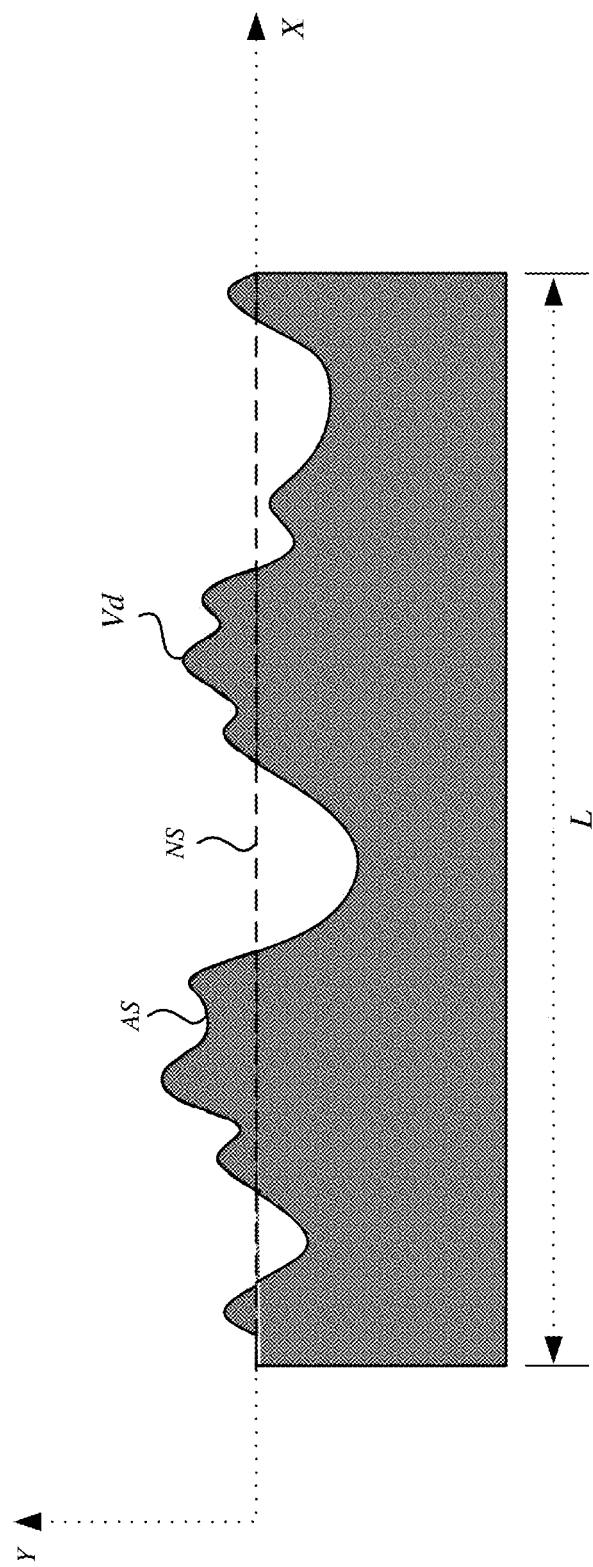
FIG. 17 illustrates an exemplary diagram of an etched metal part, in accordance, with some embodiments.

FIG. 17 illustrates an exemplary diagram of an etched metal part, in accordance with some embodiments. In particular, the etched metal part may correspond to any one of the texturized metal part 230, the blasted metal part 1130, the blasted anodized part 1220, or the multiple anodized part 1230. As described above, any one of these etched metal parts may include peaks and valleys along an actual surface (AS), which are defined as vertical deviations (Vd) from a nominal surface (NS) of the etched metal part. The vertical deviations (Vd) over the nominal surface (NS) occur over a specified length (L) over the etched metal part. The vertical deviations (Vd) can include positive vertical deviations that extend above the nominal surface (NS) and negative vertical deviations that extend below the nominal surface (NS). The positive vertical deviations are in the form of peaks and the negative vertical deviations are in the form of valleys.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%, such as less than or equal to ±0.1%.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An enclosure for a portable electronic device, the enclosure comprising:
a titanium substrate defining a textured surface having peaks separated by valleys, wherein apexes of the peaks are separated from troughs of the valleys by at least 2 micrometers, the textured surface having an Sq (root mean square height) that is greater than 0.2 micrometers and a gloss value that is greater than 90 gloss units as measured at 60 degrees by a gloss meter.

2. The enclosure of claim 1, wherein the textured surface has an Sdq (root mean square gradient) that is greater than 0.2 micrometers.

3. The enclosure of claim 1, wherein the textured surface has a gloss value that is greater than 20 gloss units as measured at 20 degrees by the gloss meter.

4. The enclosure of claim 1, further comprising:
an anodized layer that overlays a portion of the textured surface.

5. The enclosure of claim 4, wherein the anodized layer has a thickness between 20 nm to 200 nm.

6. An enclosure for a portable electronic device, the enclosure comprising:
a titanium substrate defining textured surface having peaks separated by valleys, wherein tops of the peaks are separated from bottoms of the valleys by a separation distance of at least 2 micrometers, wherein the textured surface has an Sq (root mean square height) that is greater than 0.2 micrometers and a gloss value that is greater than 90 gloss units as measured at 60 degrees by a gloss meter; and
an anodized layer that overlays a portion of the textured surface.

7. The enclosure of claim 6, wherein the anodized layer has a thickness between 20 nm to 200 nm.

8. The enclosure of claim 7, wherein the anodized layer has a color that depends on the thickness of the anodized layer.

9. The enclosure of claim 6, wherein, using a CIE L*a*b* color space model, the anodized layer has an a* value between −6 to 10 and a b* value between −20 to 30.

10. The enclosure of claim 6, wherein the anodized layer overlays more of the valleys than the peaks.

11. The enclosure of claim 6, wherein the textured surface has an Sdq (root mean square gradient) that is greater than 0.2 micrometers.

* * * * *